United States Patent
Park et al.

(10) Patent No.: US 11,611,057 B2
(45) Date of Patent: Mar. 21, 2023

(54) DISPLAY DEVICE

(71) Applicant: Samsung Display Co., Ltd., Yongin-si (KR)

(72) Inventors: Jinwoo Park, Asan-si (KR); Wonkyu Kwak, Seongnam-si (KR); Dongwook Kim, Asan-si (KR); Hyun-Chol Bang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/718,921

(22) Filed: Dec. 18, 2019

(65) Prior Publication Data

US 2020/0194730 A1 Jun. 18, 2020

(30) Foreign Application Priority Data

Dec. 18, 2018 (KR) .................. 10-2018-0164413

(51) Int. Cl.
| | | |
|---|---|---|
| *H01L 51/52* | (2006.01) | |
| *H01L 27/32* | (2006.01) | |
| *H01L 27/12* | (2006.01) | |

(52) U.S. Cl.
CPC ...... *H01L 51/5281* (2013.01); *H01L 27/3218* (2013.01); *H01L 27/3223* (2013.01); *H01L 27/3262* (2013.01); *H01L 51/5225* (2013.01); H01L 27/1214 (2013.01); H01L 27/3216 (2013.01); H01L 51/5293 (2013.01)

(58) Field of Classification Search
CPC .............. H01L 51/5281; H01L 51/5225; H01L 51/5293; H01L 27/3218; H01L 27/3223; H01L 27/3262; H01L 27/3211; H01L 27/3248; H01L 27/1214; H01L 27/3216; G09F 9/33
See application file for complete search history.

(56) References Cited

U.S. PATENT DOCUMENTS

| | | |
|---|---|---|
| 8,467,177 B2 | 6/2013 | Mathew et al. |
| 9,618,669 B2 | 4/2017 | Chen et al. |
| 2014/0110672 A1 | 4/2014 | Hack |

(Continued)

FOREIGN PATENT DOCUMENTS

| | | |
|---|---|---|
| CN | 101473439 | 7/2009 |
| JP | 2001318204 | 11/2001 |

(Continued)

OTHER PUBLICATIONS

Extended European Search Report dated May 13, 2020, in European Patent Application No. 19217290.6.

*Primary Examiner* — Nilufa Rahim
(74) *Attorney, Agent, or Firm* — H.C. Park & Associates, PLC

(57) ABSTRACT

A display device includes a window, an anti-reflector disposed under the window, the anti-reflector including: a first area having a first transmittance; and a second area having a second transmittance higher than the first transmittance, and a display panel disposed under the anti-reflector, the display panel including: a first display area having a first resolution; and a second display area having a second resolution lower than the first resolution. The second area overlaps with the second display area in a plan view.

18 Claims, 28 Drawing Sheets

(56) References Cited

U.S. PATENT DOCUMENTS

| | | | | |
|---|---|---|---|---|
| 2014/0118826 A1* | 5/2014 | Jiao | ........................ | G02B 5/30 |
| | | | | 359/491.01 |
| 2014/0139458 A1 | 5/2014 | Premutico et al. | | |
| 2016/0233273 A1* | 8/2016 | Ohyama | .............. | G02B 5/3083 |
| 2018/0129328 A1 | 5/2018 | Park et al. | | |
| 2019/0035859 A1* | 1/2019 | Kang | .................. | H01L 51/5225 |
| 2019/0196635 A1 | 6/2019 | Park et al. | | |
| 2019/0206953 A1* | 7/2019 | Hsieh | .................. | H01L 51/5234 |

FOREIGN PATENT DOCUMENTS

| | | | | |
|---|---|---|---|---|
| KR | 10-2018-0050473 | | 5/2018 | |
| WO | WO-2020019870 A1 * | 1/2020 | ............. | H01L 27/32 |

\* cited by examiner

DISPLAY DEVICE

CROSS-REFERENCE TO RELATED APPLICATION

This application claims priority from and the benefit of Korean Patent Application No. 10-2018-0164413, filed on Dec. 18, 2018, which is hereby incorporated by reference for all purposes as if fully set forth herein.

BACKGROUND

Field

Exemplary embodiments/implementations of the invention relate generally to a display device and, more specifically, to a display device including an electronic module with an improved sensing sensitivity and having an improved display quality.

Discussion of the Background

A display device includes devices having various electronic parts, such as a display panel displaying an image, an input sensing member sensing an external input, and an electronic module. The electronic parts are electrically connected to each other by signal lines arranged in various ways.

The display panel includes a light emitting device generating the image. The input sensing member includes sensing electrodes that sense the external input. The electronic module may include a camera, an infrared sensing sensor, a proximity sensor, and the like. The electric module may be disposed under the display panel.

The above information disclosed in this Background section is only for understanding of the background of the inventive concepts, and, therefore, it may contain information that does not constitute prior art.

SUMMARY

Devices constructed according to exemplary implementations of the invention provide a display device including an electronic module with an improved sensing sensitivity and a display device having an improved display quality.

Additional features of the inventive concepts will be set forth in the description which follows, and in part will be apparent from the description, or may be learned by practice of the inventive concepts.

According to one or more exemplary embodiments of the invention, a display device includes a window and an anti-reflector disposed under the window. The anti-reflector includes: a first area having a first transmittance; and a second area having a second transmittance higher than the first transmittance. The display device also includes a display panel disposed under the anti-reflector, the display panel including: a first display area having a first resolution; and a second display area having a second resolution lower than the first resolution. The second area overlaps with the second display area in a plan view.

The display device further may include an electronic module disposed under the second display area of the display panel.

The anti-reflector may include a polarizer.

The second area of the anti-reflector may be decolored.

The anti-reflector may include a hole formed through the second area of the anti-reflector.

The second display area may include a first sub-area having a first reflectance and a second sub-area having a second reflectance, and the first reflectance may be higher than the second reflectance.

The first sub-area may include at least one pixel disposed therein, the pixel including a light emitting element including a first electrode, a light emitting layer, and a second electrode; and a pixel circuit electrically connected to the light emitting element, and the pixel circuit includes a signal line and a transistor.

The second sub-area may include at least one dummy pixel disposed therein, the dummy pixel comprising same structure as the pixel disposed in the first sub-area with at least one of the first electrode, the light emitting layer, the second electrode, and the transistor omitted from the pixel.

The second electrode in the second sub-area may include an opening formed therethrough.

The second electrode may include a first electrode portion having a first thickness and a second electrode portion having a second thickness different from the first thickness, the first electrode portion may be disposed in the first display area and the first sub-area, and the second electrode portion may be disposed in the second sub-area.

The first sub-area may include a plurality of first sub-areas and the second sub-area may include a plurality of second sub-areas, and the plurality of first sub-areas and the plurality of second sub-areas may be alternatively arranged in a first direction and a second direction crossing the first direction.

The second sub-area may include a plurality of second sub-areas, and the first sub-area may be surrounded by the plurality of second sub-areas.

The first sub-area may include at least one pixel light emitting area.

The second area may be surrounded by the first area when viewed in a plan view, and the second display area may be surrounded by the first display area.

The second area may be disposed adjacent to an edge of the anti-reflector, and at least one side of the second area may be shared with the first area.

According to one or more exemplary embodiments of the invention, a display device includes a window, an anti-reflector disposed under the window, the anti-reflector including a first area and a second area having different transmittances from each other, a display panel disposed under the anti-reflector, the display panel including a first display area and a second display area having different reflectances from each other, and an electronic module disposed under the display panel. The second area, the second display area, and the electronic module overlap with each other in a plan view.

The first area may have a first transmittance and the second area has a second transmittance, the first transmittance being lower than the second transmittance of the second area, and the first display area may have a first reflectance and the second display area has a second reflectance, the first reflectance being higher than the second reflectance.

The anti-reflector may include a polarizer, and the second area may be decolored or include a hole defined therein.

The second display area may include: a first sub-area including at least one pixel disposed therein; and a second sub-area in which at least one dummy pixel is disposed, the pixel may include a light emitting element and a pixel circuit electrically connected to the light emitting element, the light emitting element may include a first electrode, a light emitting layer, and a second electrode, the pixel circuit includes a signal line and a transistor, and wherein the dummy pixel may include same structure as the pixel disposed in the first sub-area with at least one of the first electrode, the light emitting layer, the second electrode, and the transistor omitted.

The second electrode in the second sub-area may include an opening formed therethrough.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
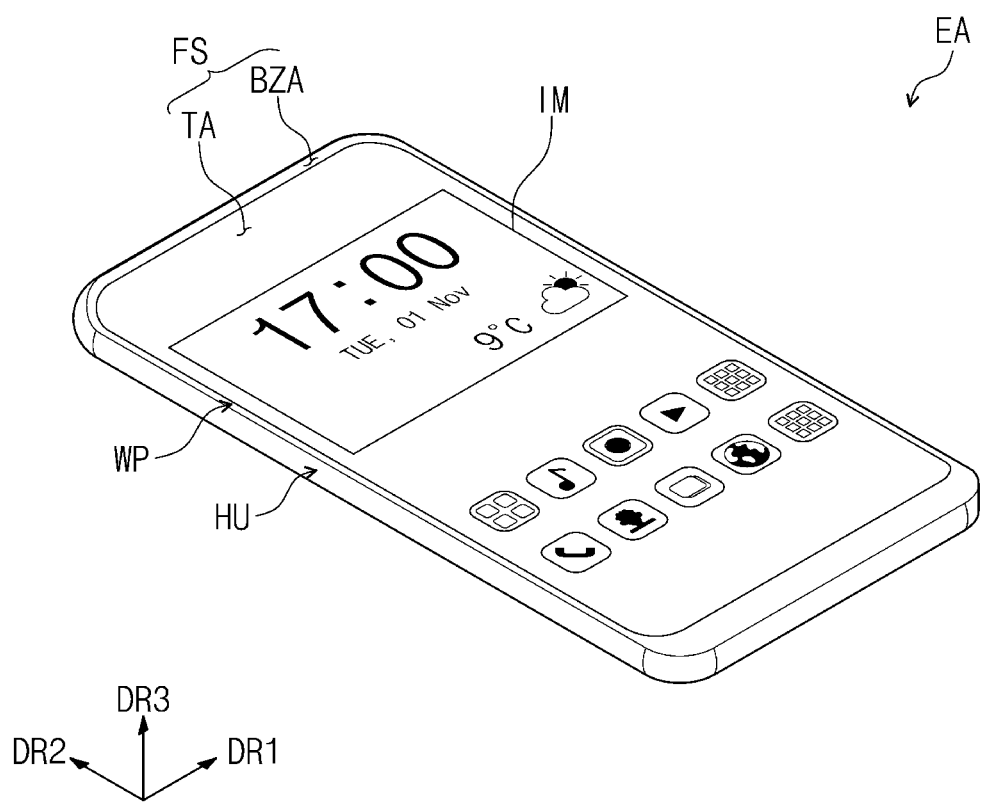
FIG. 1A is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Accordingly, the expression that component "B" is directly disposed on component "A" means that no intervening elements, such as an adhesive layer/an adhesive member, are present between the component "B" and the component "A". The component "B" is formed on a base surface provided by the component "A" through successive processes after the component "A" is formed. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the present disclosure will be explained in detail with reference to the accompanying drawings.

Figure 1B:
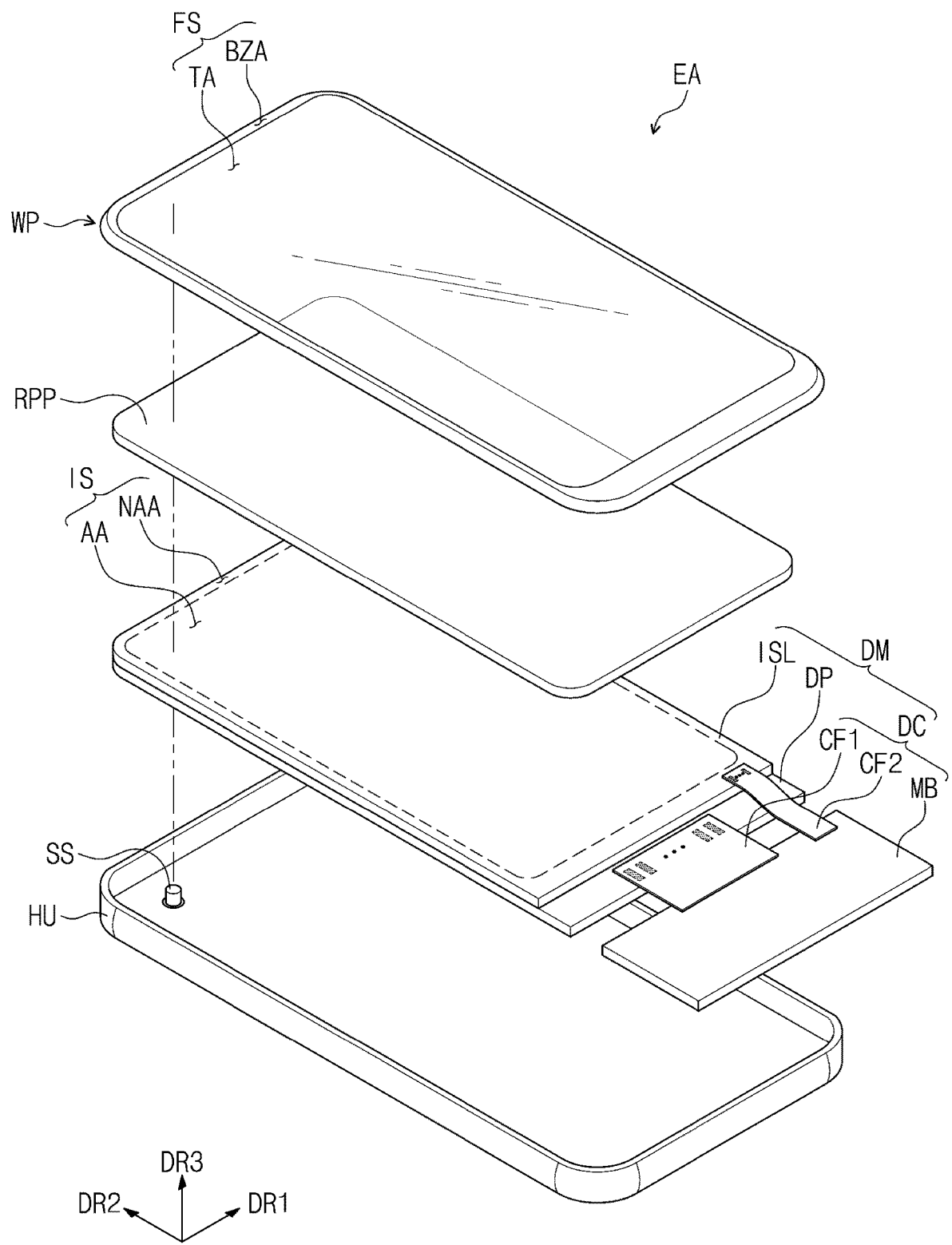
FIG. 1B is an exploded perspective view illustrating a display device according to an exemplary embodiment.

FIG. 1A is an assembled perspective view illustrating a display device EA according to an exemplary embodiment. FIG. 1B is an exploded perspective view illustrating the display device EA according to an exemplary embodiment.

Referring to FIGS. 1A and 1B, the display device EA may be a device activated in response to an electrical signal. The display device EA may include various embodiments. For example, the display device EA may be applied to a large-sized electronic item, such as a television set, a monitor, or an outdoor billboard, and a small and medium-sized electronic item, such as a personal computer, a notebook computer, a personal digital assistants, a navigation unit, a game unit, a mobile electronic device, and a camera. These are merely exemplary, and thus the display device EA may be applied to other electronics as long as they do not depart from the concept. In the present exemplary embodiment, a smartphone will be described as the display device EA.

The display device EA displays an image IM through a display surface FS that is substantially parallel to each of a first direction DR1 and a second direction DR2 toward a third direction DR3. The image IM includes a motion image and a still image. FIG. 1A shows a clock window and icons as a representative example of the image IM. The display surface FS, through which the image IM is displayed, corresponds to a front surface of the display device EA and a front surface of a window panel WP.

In the present exemplary embodiment, front (or upper) and rear (or lower) surfaces of each member of the display device EA are defined with respect to a direction in which the image IM is displayed. The front and rear surfaces face each other in a third direction DR3, and a normal line direction of each of the front and rear surfaces is substantially parallel to the third direction DR3. Directions indicated by the first, second, and third directions DR1, DR2, and DR3 are relative to each other, and thus the directions indicated by the first, second, and third directions DR1, DR2, and DR3 may be changed to other directions.

The display device EA according to the exemplary embodiment may sense a user input applied thereto from an outside. The user input includes various forms of external inputs, such as a portion of the user body, light, heat, or pressure. In addition, the display device EA may sense the user input applied to a side or rear surface of the display device EA depending on a structure of the display device EA, however, the display device EA should not be limited to a particular embodiment.

The display device EA includes the window panel WP, an anti-reflective panel RPP, a display module DM, an electronic module SS, and a housing HU. In the present exemplary embodiment, the window panel WP and the housing HU are coupled to each other to provide an exterior of the display device EA.

The window panel WP includes an optically transparent insulating material. For example, the window panel WP includes a glass or plastic material. The window panel WP has a single-layer or multi-layer structure. As an example, the window panel WP includes a plurality of plastic films attached to each other by an adhesive or a glass substrate and a plastic film attached to the glass substrate by an adhesive.

The front surface FS of the window panel WP defines the front surface of the display device EA as described above. A transmissive area TA may be an optically transparent area. For example, the transmissive area TA may be an area having a visible light transmittance of about 90% or more.

A bezel area BZA may be an area having a relatively lower transmittance as compared with the transmissive area TA. The bezel area BZA defines a shape of the transmissive area TA. The bezel area BZA is disposed adjacent to the transmissive area TA and surrounds the transmissive area TA.

The bezel area BZA has a predetermined color. The bezel area BZA covers a peripheral area NAA of the display module DM to prevent or suppress the peripheral area NAA from being viewed from the outside. However, this is merely exemplary, and the bezel area BZA may be omitted from the window panel WP according to the exemplary embodiment.

The anti-reflective panel RPP is disposed under the window panel WP. The anti-reflective panel RPP reduces a reflectance of an external light incident thereto from above the window panel WP.

The display module DM displays the image IM and senses the external input. The display module DM includes a front surface IS including an active area AA and the peripheral area NAA. The active area AA may be an area activated in response to an electrical signal.

In the present exemplary embodiment, the active area AA may be an area through which the image IM is displayed and the external input is sensed. The transmissive area TA overlaps with at least the active area AA. For example, the transmissive area TA overlaps with an entire surface or at least a portion of the active area AA. Accordingly, the user perceives the image IM or provides the external input through the transmissive area TA, however, this is merely exemplary. That is, an area through which the image IM is displayed and an area through which the external input is sensed may be separated from each other in the active area AA, but they should not be limited to a particular embodiment.

The peripheral area NAA may be covered by the bezel area BZA. The peripheral area NAA may be disposed adjacent to the active area AA. The peripheral area NAA may surround the active area AA. A driving circuit or a driving wiring line may be disposed in the peripheral area NAA to drive the active area AA.

In the present exemplary embodiment, the display module DM is assembled in a flat state in which the active area AA and the peripheral area NAA face the window panel WP, however, this is merely exemplary. According to another exemplary embodiment, a portion of the peripheral area NAA of the display module DM may be curved. In this case, the portion of the peripheral area NAA faces the rear surface of the display device EA, and thus the bezel area BZA in the front surface of the display device EA may be reduced. As another way, the display module DM may be assembled such that a portion of the active area AA is curved. Further, the peripheral area NAA may be omitted from the display module DM according to the exemplary embodiment.

The display module DM includes a display panel DP, an input sensing layer ISL, and a driving circuit DC.

The display panel DP includes a configuration to generate the image IM. The image IM generated by the display panel DP is perceived by the user through the transmissive area TA.

The input sensing layer ISL senses the external input applied from the outside. As described above, the input sensing layer ISL senses the external input applied to the window panel WP.

The driving circuit DC is electrically connected to the display panel DP and the input sensing layer ISL. The driving circuit DC includes a main circuit board MB, a first circuit board CF1, and a second circuit board CF2.

The first circuit board CF1 is electrically connected to the display panel DP. The first circuit board CF1 connects the display panel DP and the main circuit board MB. In the present exemplary embodiment, a flexible circuit film is shown as the first circuit board CF1, however, this is merely exemplary. The first circuit board CF1 may not be connected to the main circuit board MB and may be a rigid board.

The first circuit board CF1 is connected to pads (display pads) of the display panel DP disposed in the peripheral area NAA. The first circuit board CF1 provides electrical signals to the display panel DP to drive the display panel DP. The electrical signals are generated by the first circuit board CF1 or the main circuit board MB.

The second circuit board CF2 is electrically connected to the input sensing layer ISL. The second circuit board CF2 connects the input sensing layer ISL and the main circuit board MB. In the present exemplary embodiment, a flexible circuit film is shown as the second circuit board CF2, however, this is merely exemplary. The second circuit board CF2 may not be connected to the main circuit board MB and may be a rigid board.

The second circuit board CF2 is connected to pads (sensing pads) of the input sensing layer ISL disposed in the peripheral area NAA. The second circuit board CF2 provides electrical signals to the input sensing layer ISL to drive the input sensing layer ISL. The electrical signals are generated by the second circuit board CF2 or the main circuit board MB.

The main circuit board MB includes various driving circuits to drive the display module DM and a connector to provide a power source. The first and second circuit boards CF1 and CF2 are connected to the main circuit board MB. According to the present disclosure, the display module DM is easily controlled by using main circuit board MB, however this is merely exemplary. In the display module DM according to an exemplary embodiment, the display panel DP and the input sensing layer ISL may be connected to different main circuit boards, and one of the first and second circuit boards CF1 and CF2 may not be connected to the main circuit board MB, however, they should not be limited to a particular embodiment.

The electronic module SS is disposed under the display module DM. The electronic module SS is disposed under the display panel DP. When viewed in a plan view, the electronic module SS is disposed to overlap with the active area AA. Accordingly, the bezel area BZA does not need to have a space for the electronic module SS, and thus the bezel area BZA may be prevented or suppressed from increasing in size.

The electronic module SS receives the external input transmitted through the transmissive area TA or provides an output through the transmissive area TA. The electronic module SS includes at least one of an infrared sensing sensor, a proximity sensor, a camera, a speaker, a light sensing sensor, and a heat sensing sensor. The electronic module SS includes a plurality of components, however, it should not be limited to a particular embodiment.

The housing HU is coupled to the window panel WP. The housing HU is coupled to the window panel WP to provide a predetermined internal space. The display module DM and the electronic module SS are accommodated in the internal space.

The housing HU has a material with a relatively high rigidity. For example, the housing HU includes a glass, plastic, or metal material or a plurality of frames and/or plates of combinations thereof. The housing HU stably protects the components accommodated in the internal space from external impacts.

FIGS. 2A, 2B, 2C, and 2D are cross-sectional views illustrating display devices EA according to an exemplary embodiment.

FIGS. 2A, 2B, 2C, and 2D illustrate cross-sections defined by the first direction DR1 and the third direction DR3. In FIGS. 2A, 2B, 2C, and 2D, the display device EA is simply shown to illustrate a stack relationship of functional elements of the display device EA.

The display device EA according to the exemplary embodiment may include a display panel, an input sensing sensor, an anti-reflector, and a window. At least some components of the display panel, the input sensing sensor, the anti-reflector, and the window may be formed through consecutive processes or may be coupled to each other by an adhesive member. FIGS. 2A, 2B, 2C, and 2D illustrate an optically clear adhesive (OCA) as the adhesive member. The adhesive member described hereinafter may include a conventional adhesive or pressure sensitive adhesive. In the exemplary embodiment, the anti-reflector and the window may be replaced with other components or may be omitted.

In FIGS. 2A, 2B, 2C, and 2D, among the input sensing sensor, the anti-reflector, and the window, components formed through the consecutive processes with other components are referred to as a "layer". Among the input sensing sensor, the anti-reflector, and the window, components coupled to other components by the adhesive member are referred to as a "panel". The panel includes a base layer providing a base surface, e.g., a synthetic resin film, a composite film, or a glass substrate, however, the base layer may be omitted from the components referred to as the "layer". In other words, the components referred to as the "layer" are disposed on the base surface provided by other components.

Hereinafter, the input sensing sensor, the anti-reflector, and the window may be referred to as an "input sensing panel ISP", an "anti-reflective panel RPP", and a "window panel WP" or as an "input sensing layer ISL", an "anti-reflective layer RPL", and a "window layer WL" depending on the presence or absence of a base layer.

Figure 2A:
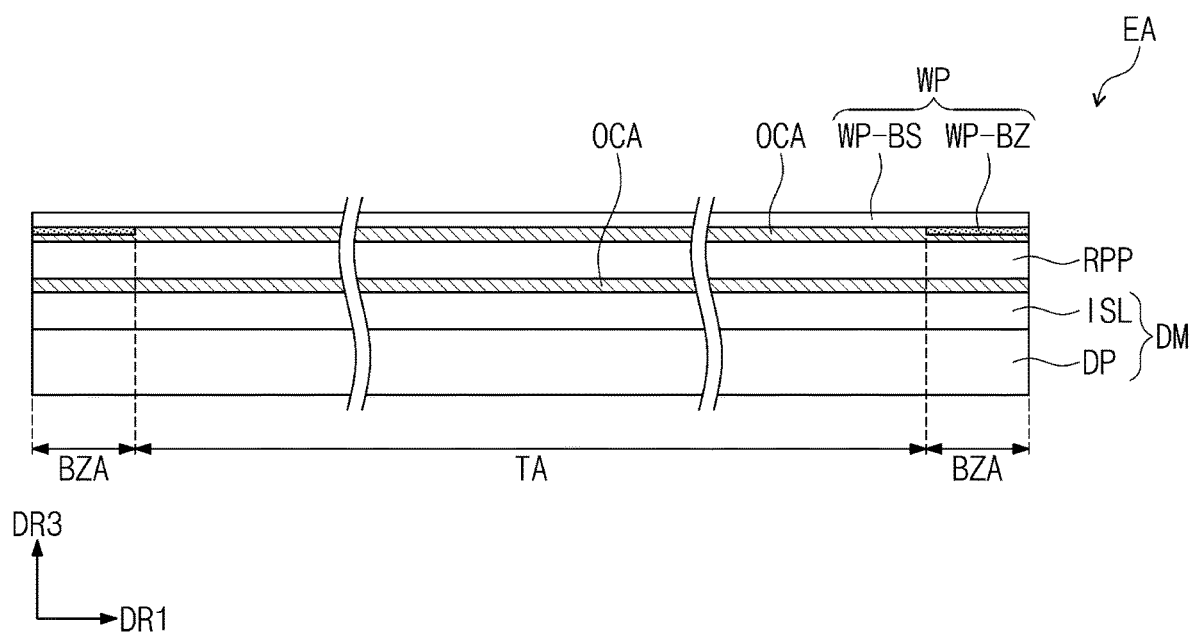
FIGS. 2A, 2B, 2C, and 2D are cross-sectional views illustrating display devices according to an exemplary embodiment.

As illustrated in FIG. 2A, the display device EA includes the display panel DP, the input sensing layer ISL, the anti-reflective panel RPP, and the window panel WP. The input sensing layer ISL is directly disposed on the display panel DP.

The display panel DP and the input sensing layer ISL directly disposed on the display panel DP are defined as the display module DM. The optically clear adhesive member OCA is disposed between the display module DM and the anti-reflective panel RPP and between the anti-reflective panel RPP and the window panel WP.

The display panel DP generates the image, and the input sensing layer ISL obtains coordinate information of the external input (e.g., touch event). Although not shown separately, the display module DM according to the exemplary embodiment further includes a protective member disposed on a lower surface of the display panel DP. The protective member and the display panel DP are coupled to each other by the adhesive member. The display devices EA described hereinafter with reference to FIGS. 2B, 2C, and 2D also further include the protective member.

The display panel DP according to the exemplary embodiment may be a light emitting type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as the display panel.

The anti-reflective panel RPP reduces a reflectance of an external light incident thereto from the above of the window panel WP. The anti-reflective panel RPP according to the exemplary embodiment may include a retarder and a polarizer. The retarder may be a film type or liquid crystal coating type and may include a λ/2 retarder and a λ/4 retarder. The polarizer may be a film type and may include a stretching type synthetic resin film. The retarder and the polarizer may further include a protective film. The retarder and the polarizer or the protective film may be defined as a base layer of the anti-reflective panel RPP.

The window panel WP according to the exemplary embodiment includes a base layer WP-BS and a light shielding pattern WP-BZ. The base layer WP-BS may include a glass substrate and/or a synthetic resin film. The base layer WP-BS should not be limited to a single-layer structure. The base layer WP-BS may include two or more films coupled to each other by an adhesive member.

The light shielding pattern WP-BZ partially overlaps with the base layer WP-BS. The light shielding pattern WP-BZ is disposed on a rear surface of the base layer WP-BS and substantially defines the bezel area BZA of the display device EA. An area in which the light shielding pattern WP-BZ is not disposed defines the transmissive area TA of the display device EA. In the window panel WP, an area in which the light shielding pattern WP-BZ is disposed is defined as a light shielding area of the window panel WP, and the area in which the light shielding pattern WP-BZ is not disposed is defined as a transmissive area of the window panel WP.

Figure 2B:
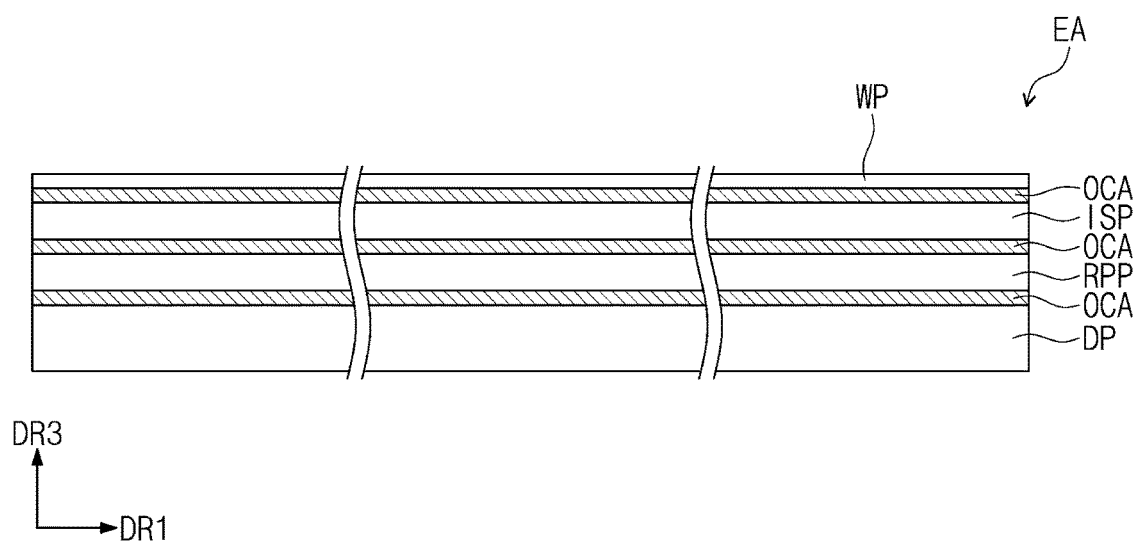
Figure 2C:
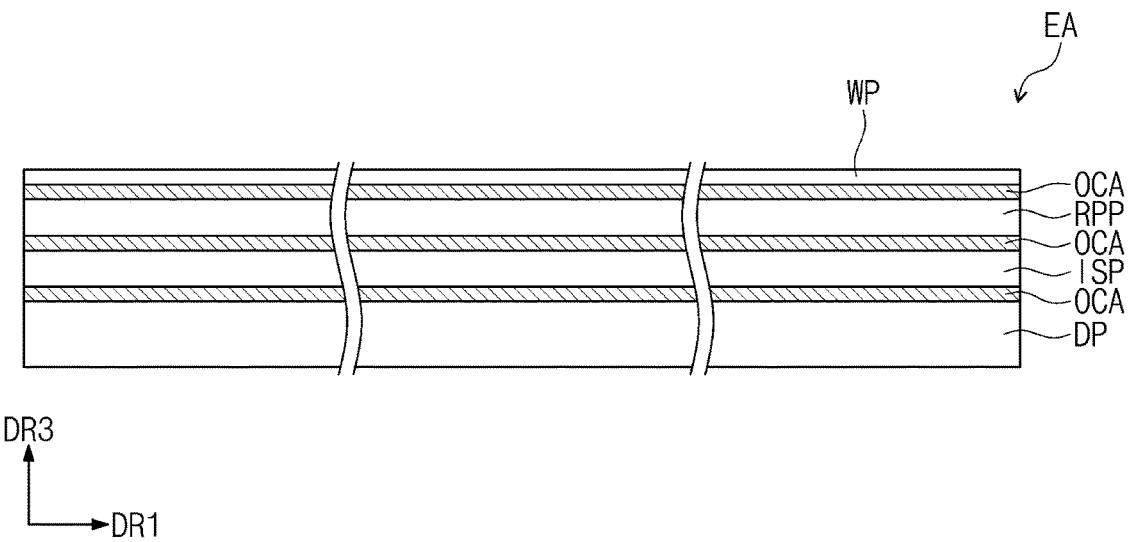
Figure 2D:
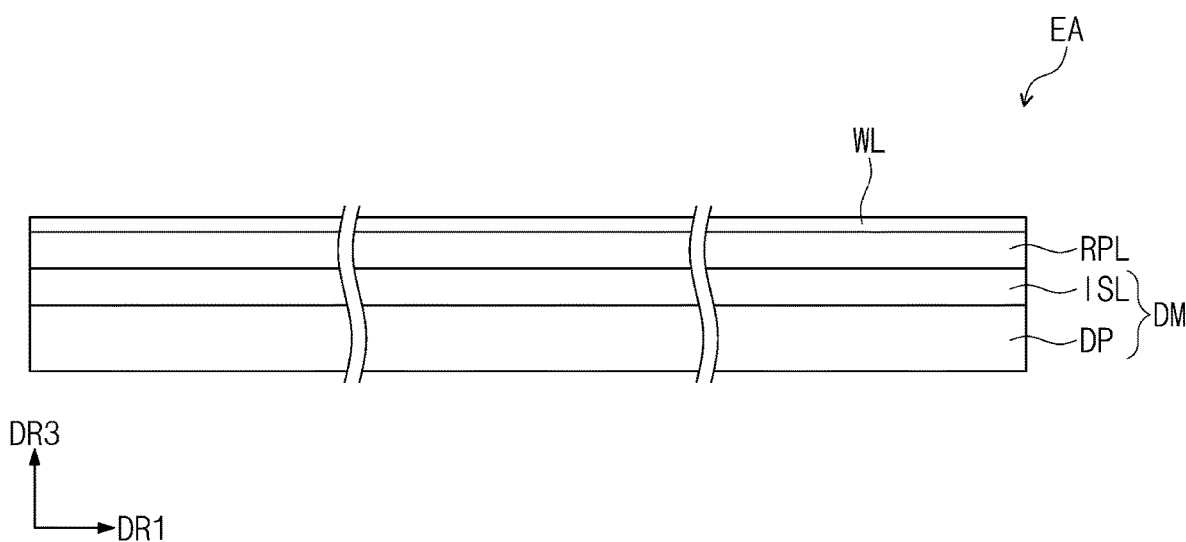

The light shielding pattern WP-BZ may have a multi-layer structure of a colored layer and a black light shielding layer. The colored layer and the black light shielding layer may be formed through deposition, printing, and coating processes. Although not shown in figures, the window panel WP may further include a functional coating layer disposed on an entire surface of the base layer WP-BS. The functional coating layer may include an anti-fingerprint layer, an anti-reflective layer, or a hard coating layer. In FIGS. 2B, 2C, and 2D, the window panel WP and the window layer WL are schematically shown without separating the base layer WP-BS from the light shielding pattern WP-BZ.

As illustrated in FIGS. 2B and 2C, the display device EA includes a display panel DP, an input sensing panel ISP, an anti-reflective panel RPP, and a window panel WP. A stacking order of the input sensing panel ISP and the anti-reflective panel RPP may be changed.

As illustrated in FIG. 2D, the display device EA includes a display panel DP, an input sensing layer ISL, an anti-reflective layer RPL, and a window layer WL. As compared with the display device EA shown in FIG. 2A, the optically clear adhesive members OCA are omitted, and the input sensing layer ISL, the anti-reflective layer RPL, and the window layer WL are formed on a base surface provided by the display panel DP through successive processes. A stacking order of the input sensing layer ISL and the anti-reflective layer RPL may be changed.

Figure 3A:
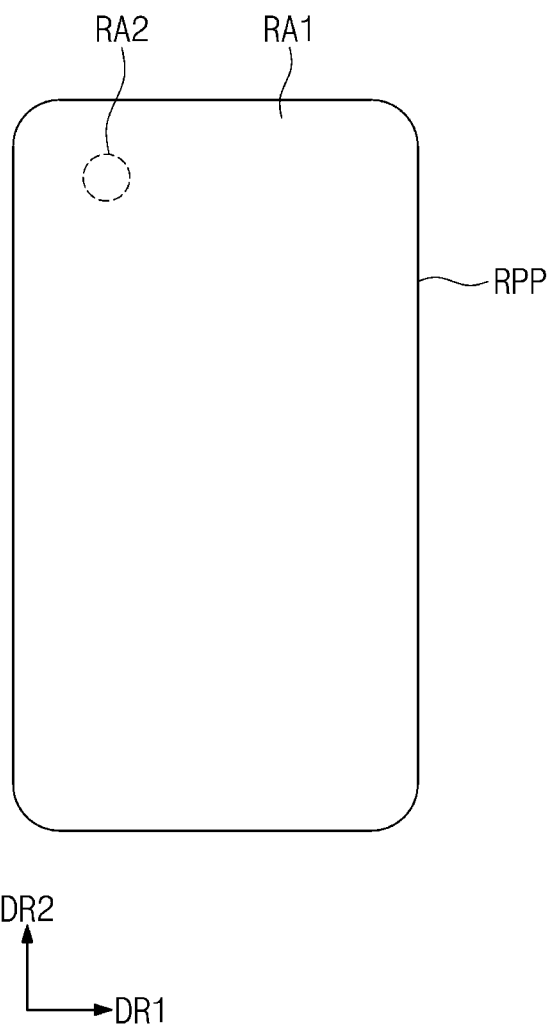
FIG. 3A is a plan view illustrating an anti-reflective panel according to an exemplary embodiment.
Figure 3B:
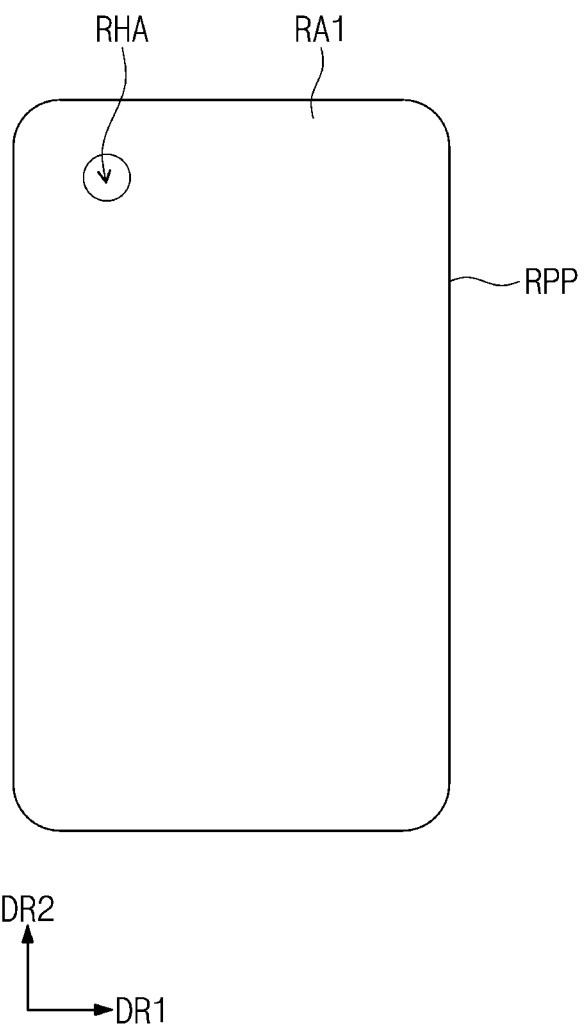
FIG. 3B is a plan view illustrating an anti-reflective panel according to an exemplary embodiment.

FIG. 3A is a plan view illustrating an anti-reflective panel RPP according to an exemplary embodiment. FIG. 3B is a plan view illustrating an anti-reflective panel RPP according to an exemplary embodiment. The structure and functions of the anti-reflective panel RPP described hereinafter may be applied to the anti-reflective layer RPL (refer to FIG. 2D).

Referring to FIGS. 3A and 3B, the anti-reflective panel RPP includes a first area RA1 and a second area RA2. The first area RA1 surrounds the second area RA2. The second area RA2 has a circular shape. The second area RA2 is an area overlapping with the electronic module SS when viewed in a plan view.

The first area RA1 has a first transmittance, and the second area RA2 has a second transmittance. The second transmittance is higher than the first transmittance. For example, when the electronic module SS is the infrared sensing sensor, the second transmittance is higher than the first transmittance in an infrared wavelength band. According to the exemplary embodiment, since the transmittance of the area overlapping with the electronic module SS increases, the sensing sensitivity of the electronic module SS may be more improved.

When the electronic module SS is the infrared sensing sensor, the electronic module SS includes a light emitting module and a light receiving module. The light emitting module emits an infrared ray, and the light receiving module senses the infrared ray. The light receiving module includes a complementary metal oxide semiconductor (CMOS) sensor. The infrared ray emitted from the light emitting module is reflected by an external object, e.g., a user's face or finger, and the reflected infrared ray is incident into the light receiving module.

Various treatments may be applied to the second area RA2 of the anti-reflective panel RPP to improve the transmittance of the second area RA2.

Referring to FIG. 3A, the second area RA2 of the anti-reflective panel RPP may be decolored. As an example, the anti-reflective panel RPP may be the polarizer, and the second area RA2 of the anti-reflective panel RPP may be decolored. Here, the second area RA2 of the anti-reflective panel RPP being decolored may mean that the transmittance of the decolored second area RA2 is higher than the transmittance of the first area RA1 that is not decolored. In addition, the second area RA2 may be a non-polarizing portion.

Referring to FIG. 3B, a hole RHA may be defined in the anti-reflective panel RPP. The hole RHA may be defined in the second area RA2 (refer to FIG. 3A). The hole RHA may be a hole completely penetrating through the anti-reflective panel RPP from an upper surface to a lower surface of the anti-reflective panel RPP, however, the present disclosure should not be limited thereto or thereby. For example, the hole RHA may be a hole formed by removing a portion of the anti-reflective panel RPP in a thickness direction.

Figure 4A:
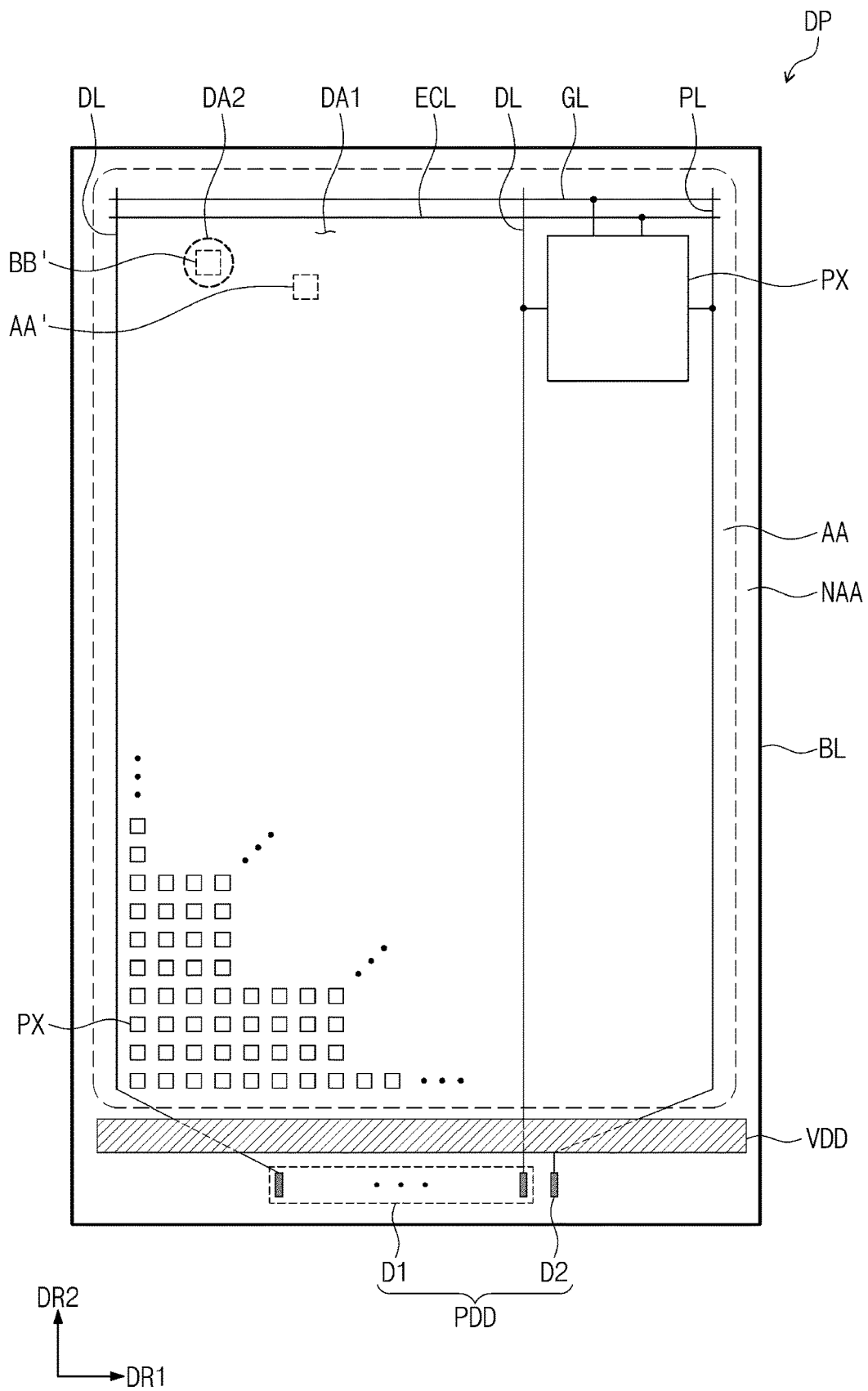
FIG. 4A is a plan view illustrating a display panel according to an exemplary embodiment.
Figure 4B:
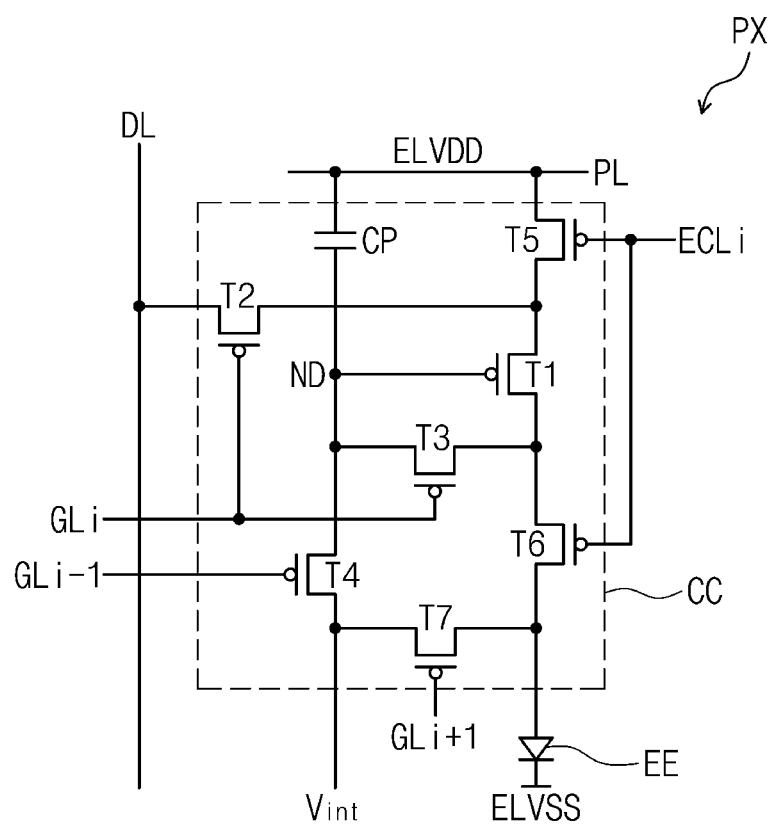
FIG. 4B is an equivalent circuit diagram illustrating a pixel according to an exemplary embodiment.

FIG. 4A is a plan view illustrating a display panel DP according to an exemplary embodiment. FIG. 4B is an equivalent circuit diagram illustrating a pixel PX according to an exemplary embodiment.

Referring to FIG. 4A, the display panel DP includes a base layer BL, a plurality of pixels PX, a plurality of signal lines GL, DL, PL, and ECL, and a plurality of display pads PDD.

The base layer BL may be a silicon substrate, a plastic substrate, a glass substrate, an insulating film, or a laminated structure including a plurality of insulating layers.

The active area AA of the display panel DP is the area through which the image IM is displayed, and the peripheral area NAA is the area in which the driving circuit or the driving wiring line is disposed. FIG. 4A illustrates the active area AA and the peripheral area NAA of the display panel DP. The pixels PX are arranged in the active area AA.

A first display area DA1 and a second display area DA2 may be defined in the display panel DP. In addition, the first display area DA1 may be the area through which the image is displayed. The first display area DA1 may surround the second display area DA2. Accordingly, the first display area DA1 and the second display area DA2 may form the active area AA of the display panel DP.

When viewed in a plan view, the first display area DA1 may overlap with the first area RA1 (refer to FIG. 3A), and the second display area DA2 may overlap with the second area RA2 (refer to FIG. 3A).

The first display area DA1 may have a resolution that is different from a resolution of the second display area DA2. As an example, the resolution of the second display area DA2 may be lower than the resolution of the first display area DA1. In addition, the first display area DA1 may have a reflectance that is different from a reflectance of the second display area DA2. As an example, the reflectance of the second display area DA2 may be lower than the reflectance of the first display area DA1. The reflectance may indicate a reflectance with respect to the external light.

The transmittance of the second area RA2 of the anti-reflective panel RPP (refer to FIG. 3A) is higher than the transmittance of the first area RA1. Accordingly, an external light reflection suppressing performance of the second area RA2 may be slightly less than an external light reflection suppressing performance of the first area RA1. However, according to the exemplary embodiment, although the external light reflection suppressing performance of the second area RA2 is reduced, the external light reflection suppressing performance of the second area RA2 may be compensated by reducing the reflectance of the second display area DA2. The external light reflection suppressing performance may be compensated by controlling the resolution and/or the reflectance of the first and second display areas DA1 and DA2 of the display panel DP.

The signal lines GL, DL, PL, and ECL are connected to the pixels PX to transmit the electrical signals to the pixels PX. Among the signal lines included in the display panel DP, a scan line GL, a data line DL, a power line PL, and a light emitting control line ECL are shown as a representative example, however, these are merely exemplary. The signal lines GL, DL, PL, and ECL may further include an initialization voltage line and should not be limited to a particular embodiment.

FIG. 4B illustrates an enlarged view of a circuit diagram of one pixel PX among the pixels as a representative example. FIG. 4B illustrates the pixel PX connected to an i-th scan line GLi and an i-th light emitting control line ECLi.

The pixel PX includes a light emitting element EE and a pixel circuit CC.

The pixel circuit CC includes a plurality of transistors T1 to T7 and a capacitor CP. The transistors T1 to T7 are formed through a low temperature polycrystalline silicon (LTPS) process or a low temperature polycrystalline oxide (LTPO) process.

The pixel circuit CC controls an amount of current flowing through the light emitting element EE in response to a data signal. The light emitting element EE emits a light at a predetermined luminance in response to the amount of the current provided from the pixel circuit CC. To this end, a first power voltage ELVDD has a level set higher than a level of a second power voltage ELVSS. The light emitting element EE includes an organic light emitting element or a quantum dot light emitting element.

Each of the transistors T1 to T7 includes an input electrode (or source electrode), an output electrode (or drain electrode), and a control electrode (or gate electrode). In the following descriptions, for the convenience of explanation, one electrode of the input electrode and the output electrode is referred to as a "first electrode", and the other electrode of the input electrode and the output electrode is referred to as a "second electrode".

A first electrode of a first transistor T1 is connected to the first power voltage ELVDD via a fifth transistor T5, and a second electrode of the first transistor T1 is connected to an anode electrode of the light emitting element EE via a sixth transistor T6. The first transistor T1 may be referred to as a "driving transistor" in the present disclosure.

The first transistor T1 controls the amount of the current flowing through the light emitting element EE in response to a voltage applied to a control electrode of the first transistor T1.

A second transistor T2 is connected between the data line DL and the first electrode of the first transistor T1. A control electrode of the second transistor T2 is connected to the i-th scan line GLi. The second transistor T2 is turned on when an i-th scan signal is applied to the i-th scan line GLi and connects the data line DL to the first electrode of the first transistor T1.

A third transistor T3 is connected between the second electrode of the first transistor T1 and the control electrode of the first transistor T1. A control electrode of the third transistor T3 is connected to the i-th scan line GLi. The third transistor T3 is turned on when the i-th scan signal is applied to the i-th scan line GLi and connects the second electrode of the first transistor T1 to the control electrode of the first transistor T1. Accordingly, when the third transistor T3 is turned on, the first transistor T1 is connected in a diode configuration.

A fourth transistor T4 is connected between a node ND and an initialization power generator. A control electrode of the fourth transistor T4 is connected to an (i−1)th scan line GLi−1. The fourth transistor T4 is turned on when an (i−1)th scan signal is applied to the (i−1)th scan line GLi−1 and provides an initialization voltage Vint to the node ND.

The fifth transistor T5 is connected between the power line PL and the first electrode of the first transistor T1. A control electrode of the fifth transistor T5 is connected to the i-th light emitting control line ECLi.

The sixth transistor T6 is connected between the second electrode of the first transistor T1 and the anode electrode of the light emitting element EE. A control electrode of the sixth transistor T6 is connected to the i-th light emitting control line ECLi.

A seventh transistor T7 is connected between the initialization power generator and the anode electrode of the light emitting element EE. The seventh transistor T7 is connected to an (i+1)th scan line GLi+1. The seventh transistor T7 is turned on when an (i+1)th scan signal is applied to the (i+1)th scan line GLi+1 and provides the initialization voltage Vint to the anode electrode of the light emitting element EE.

The seventh transistor T7 may improve a black expression ability. In detail, when the seventh transistor T7 is turned on, a parasitic capacitance of the light emitting element EE is discharged. Accordingly, when implementing a black luminance, the light emitting element EE does not emit the light due to a leakage current from the first transistor T1, and thus the black expression ability may be improved.

Additionally, in FIG. 4B, a control electrode of the seventh transistor T7 is connected to the (i+1)th scan line GLi+1, however, it should not be limited thereto or thereby. According to another exemplary embodiment, the control electrode of the seventh transistor T7 may be connected to the i-th scan line GLi or the (i−1)th scan line GLi−1.

FIG. 4B illustrates a PMOS as a reference of the pixel circuit CC, however, it should not be limited thereto or thereby. According to another exemplary embodiment, the pixel circuit CC may be implemented by an NMOS. According to another exemplary embodiment, the pixel circuit CC may be implemented by a combination of the NMOS and the PMOS.

The capacitor CP is disposed between the power line PL and the node ND. The capacitor CP is charged with a voltage corresponding to the data signal. When the fifth and sixth transistors T5 and T6 are turned on, the amount of the current flowing through the first transistor T1 is determined by the voltage charged in the capacitor CP.

In the present disclosure, the equivalent circuit of the pixel PX should not be limited to the equivalent circuit shown in FIG. 4B. According to another exemplary embodiment, the pixel PX may be implemented in various ways to allow the light emitting element EE to emit the light.

Referring to FIG. 4A again, a power pattern VDD is disposed in the peripheral area NAA. In the present exemplary embodiment, the power pattern VDD is connected to the power lines PL. Accordingly, the display panel DP includes the power pattern VDD, and thus the pixels may receive the same first power supply signal.

The display pads PDD include a first pad D1 and a second pad D2. The first pad D1 is provided in plural number, and the first pads D1 are respectively connected to the data lines DL. The second pad D2 is connected to the power pattern VDD to be electrically connected to the power line PL. The display panel DP applies the electrical signals, which are provided from the outside through the display pads PDD, to the pixels PX. Meanwhile, the display pads PDD may further include pads to receive other electrical signals in addition to the first and second pads D1 and D2 and should not be limited to a particular embodiment.

Figure 5:
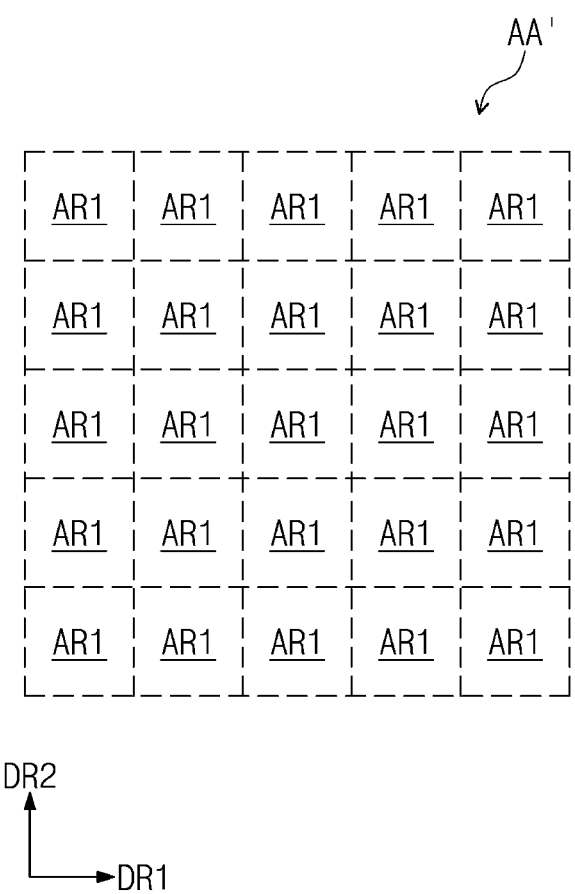
FIG. 5 is an enlarged plan view illustrating a portion AA' of FIG. 4A.

FIG. 5 is an enlarged plan view illustrating a portion AA' of FIG. 4A. FIG. 5 shows the enlarged view of a portion of the first display area DA1 of FIG. 4A.

Referring to FIGS. 4A and 5, the first display area DA1 may be divided into a plurality of sub-areas AR1. Each of the sub-areas AR1 includes at least one pixel disposed therein. The sub-areas AR1 are arranged in the first and second directions DR1 and DR2.

FIGS. 6A, 6B, 6C, 6D, 6E, 6F, and 6G are enlarged plan views illustrating a portion BB' of FIG. 4A. FIGS. 6A, 6B, 6C, 6D, 6E, 6F, and 6G illustrate the enlarged view of a portion of the second display area DA2 of FIG. 4A.

The second display area DA2 includes a first sub-area AR1 and a second sub-area AR2. The first sub-area AR1 is substantially the same as one of the sub-areas AR1 of FIG. 5. For the convenience of division, a circle is displayed around the first sub-area AR1 in FIGS. 6A, 6B, 6C, 6D, 6E, 6F, and 6G.

The first sub-area AR1 may have a first reflectance higher than a second reflectance of the second sub-area AR2. That is, the reflectance of the second display area DA2 may decrease by the second sub-area AR2.

At least one pixel may be disposed in the first sub-area AR1, and at least one dummy pixel may be disposed in the second sub-area AR2. The dummy pixel may be a pixel from which some of components for the pixel are omitted. The dummy pixel may not provide the light. That is, the second sub-area AR2 may be an area that does not include the pixel. When the pixel provides the image, the dummy pixel may not provide the image. The second sub-area AR2 may be referred to as a "low reflective area, transmissive area, non-display area, non-light emitting area, or semi-transmissive area". Since the second display area DA2 includes the second sub-area AR2 that does not provide the image, the resolution of the second display area DA2 may be lower than that of the first display area DA1.

The first sub-area AR1 may be one of a plurality of first sub-areas AR1 (hereinafter, referred to as "first sub-areas"), and the second sub-area AR2 may be one of a plurality of second sub-areas AR2 (hereinafter, referred to as "second sub-areas"). The first sub-areas AR1 and the second sub-areas AR2 may be arranged with a predetermined rule.

FIGS. 6A, 6B, 6C, 6D, 6E, 6F, and 6G illustrate arrangements of the first sub-areas AR1 and the second sub-areas AR2 as a representative example, however, they should not be limited thereto or thereby. The arrangements of the first sub-areas AR1 and the second sub-areas AR2 may be changed in various ways as long as the second display area DA2 includes the first sub-areas AR1 and the second sub-areas AR2.

Figure 6A:
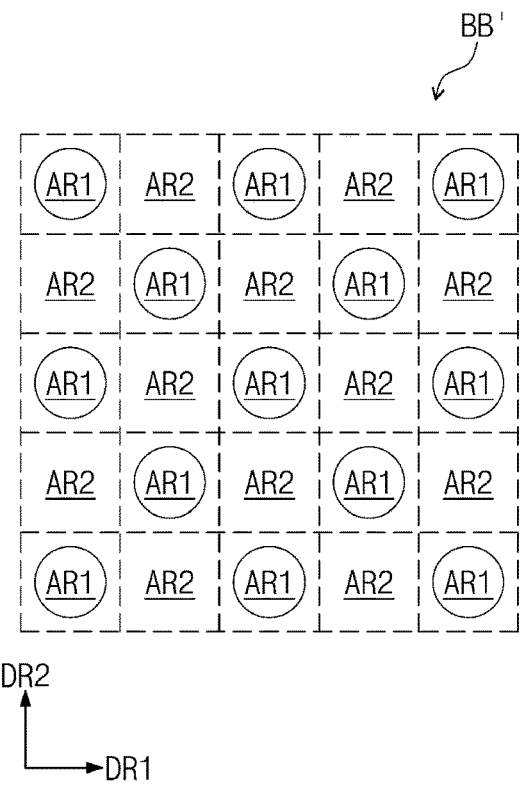
FIGS. 6A, 6B, 6C, 6D, 6E, 6F, and 6G are enlarged plan views illustrating a portion BB' of FIG. 4A.

Referring to FIG. 6A, the first sub-areas AR1 are alternately arranged with the second sub-areas AR2 in the first and second directions DR1 and DR2. For example, one first sub-area AR1 and one second sub-area AR2 may be alternately arranged with each other.

Figure 6B:
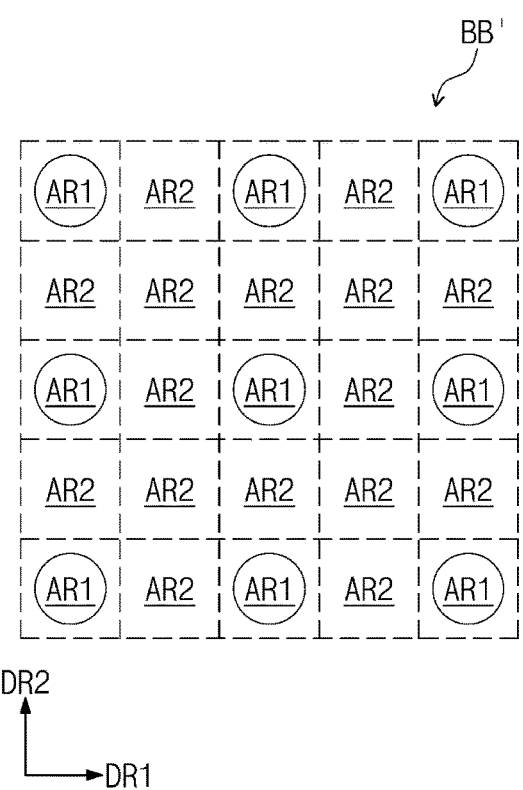

When compared with FIG. 6A, the reflectance of FIG. 6B may be lower than that of FIG. 6A because the number of the second sub-areas AR2 in FIG. 6B is larger than that in FIG. 6A in the same area.

Referring to FIG. 6B, each of the first sub-areas AR1 may be surrounded by the second sub-areas AR2. As an example, a first row and a second row may be alternately arranged with each other along the second direction DR2. The first row may be a row in which one first sub-area AR1 and one second sub-area AR2 are alternately arranged with each other along the first direction DR1. The second row may be a row in which the second sub-areas AR2 are arranged along the first direction DR1.

Figure 6C:
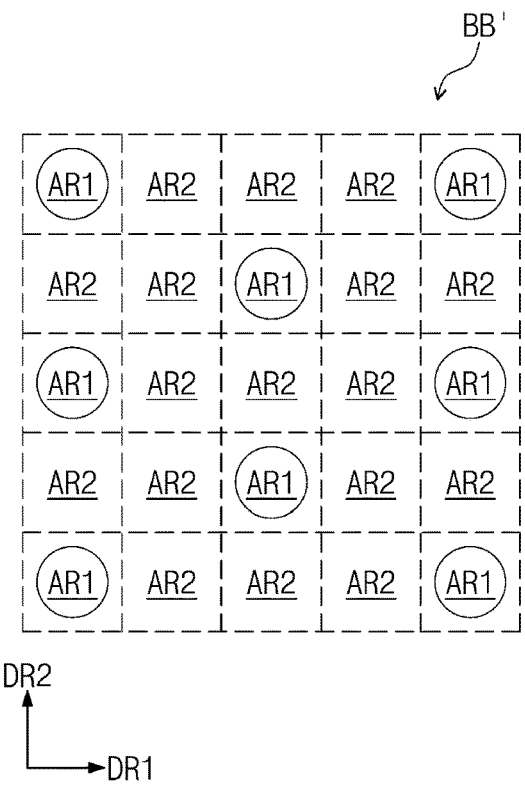

Referring to FIG. 6C, each of the first sub-areas AR1 may be surrounded by the second sub-areas AR2. As an example, a set of a first column, a second column, a third column, and the second column, which are sequentially arranged along the first direction DR1, may be repeatedly arranged along the first direction DR1. The first column may be a column in which one first sub-area AR1 and one second sub-area AR2 are alternately arranged with each other along the second direction DR2. The second column may be a column in which the second sub-areas AR2 are arranged along the second direction DR2. The third column may be a column in which one first sub-area AR1 and one second sub-area AR2 are alternately arranged with each other along the second direction DR2. When even-numbered rows of the first column is the second sub-area AR2, even-numbered rows of the third column may be the first sub-area AR1.

Figure 6D:
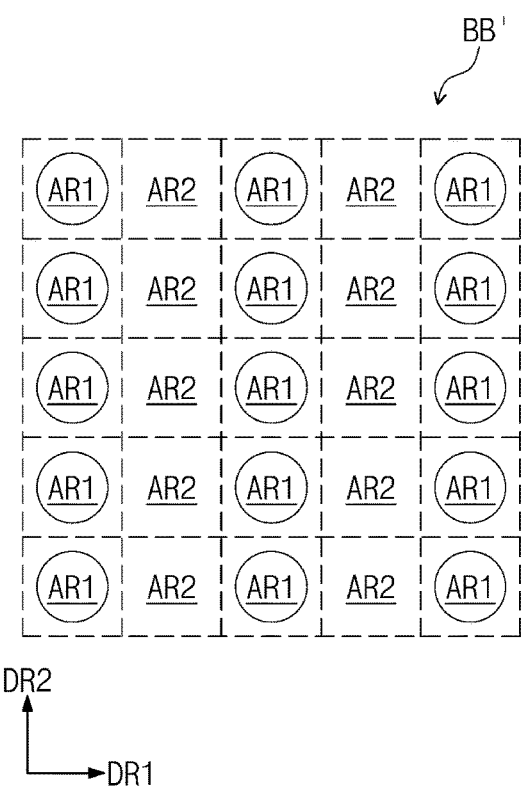

Referring to FIG. 6D, a first column and a second column may be alternately arranged with each other along the first direction DR1. The first column may be a column in which the first sub-areas AR1 are arranged along the second direction DR2. The second column may be a column in which the second sub-areas AR2 are arranged along the second direction DR2.

Figure 6E:
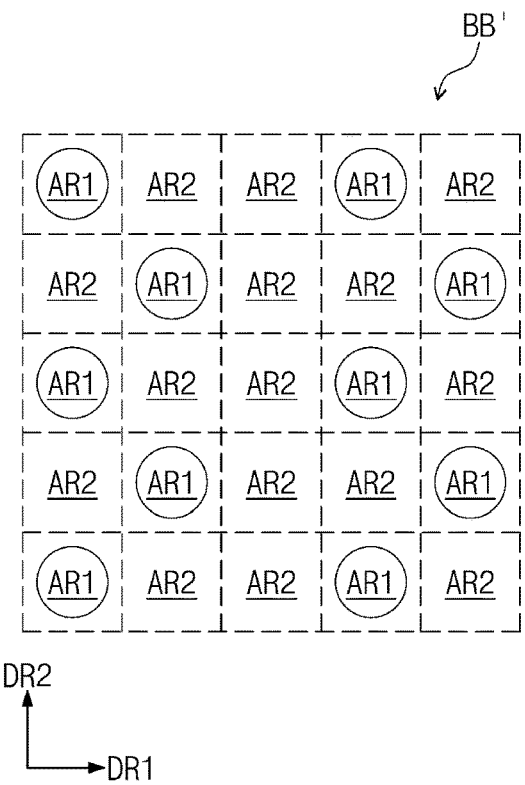

Referring to FIG. 6E, a set of a first column, a second column, and a third column, which are sequentially arranged along the first direction DR1, may be repeatedly arranged along the first direction DR1. Each of the first and second columns may be a column in which one first sub-area AR1 and one second sub-area AR2 are alternately arranged with each other along the second direction DR2. The third column may be a column in which the second sub-areas AR2 are arranged along the second direction DR2. When even-numbered rows of the first column is the second sub-area AR2, even-numbered rows of the second column may be the first sub-area AR1.

Figure 6F:
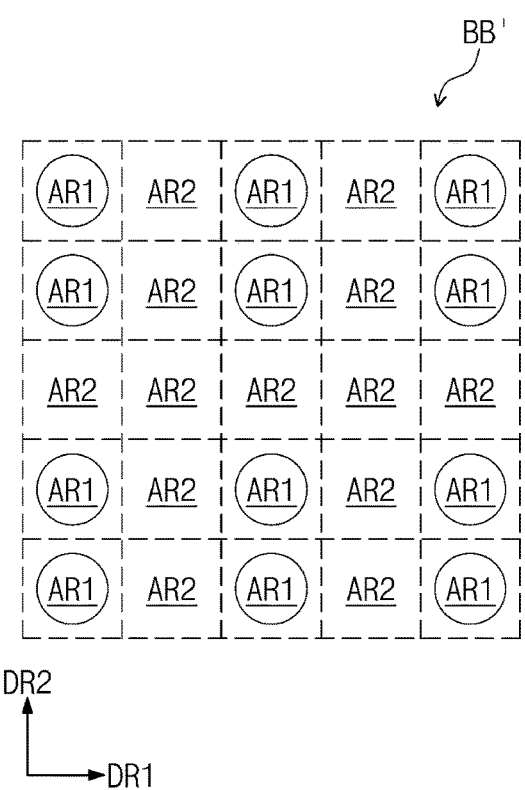

Referring to FIG. 6F, two first rows are alternately arranged with one second row along the second direction DR2. Each of the first rows may be a row in which one first sub-area AR1 and one second sub-area AR2 are alternately arranged with each other along the first direction DR1. The second row may be a row in which the second sub-areas AR2 are arranged along the first direction DR1.

Figure 6G:
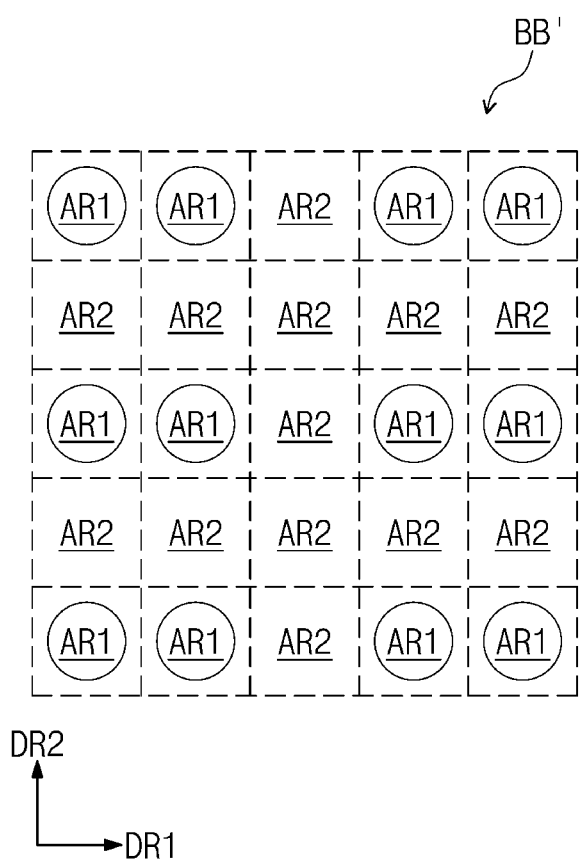

Referring to FIG. 6G, two first columns are alternately arranged with one second column along the first direction DR1. Each of the first columns may be a column in which one first sub-area AR1 and one second sub-area AR2 are alternately arranged with each other along the second direction DR2. The second column may be a column in which the second sub-areas AR2 are arranged along the second direction DR2.

FIGS. 7A, 7B, 7C, 7D, 7E, and 7F are enlarged plan views illustrating a portion of FIG. 5.

FIGS. 7A, 7B, 7C, 7D, 7E, and 7F are plan views illustrating pixel light emitting areas arranged in the first sub-area AR1. The first sub-area AR1 includes at least one pixel disposed therein. The pixel light emitting area is defined in the pixel. The pixel light emitting area provides a predetermined light and is defined by a pixel definition layer PDL (refer to FIG. 8) described later.

Figure 7A:
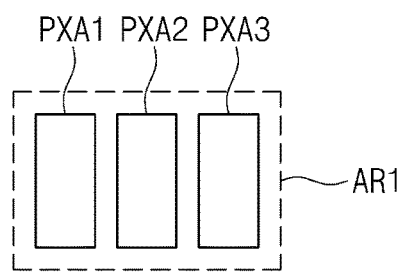
FIGS. 7A, 7B, 7C, 7D, 7E, and 7F are enlarged plan views illustrating a portion of FIG. 5.

Referring to FIG. 7A, the first sub-area AR1 may include a first pixel light emitting area PXA1, a second pixel light emitting area PXA2, and a third pixel light emitting area PXA3.

The pixels PX (refer to FIG. 4A) may include a red pixel generating a red light, a green pixel generating a green light, and a blue pixel generating a blue light. In the present exemplary embodiment, the first pixel light emitting area PXA1, the second pixel light emitting area PXA2, and the third pixel light emitting area PXA3 may correspond to the red pixel, the green pixel, and the blue pixel, respectively.

The first pixel light emitting area PXA1, the second pixel light emitting area PXA2, and the third pixel light emitting area PXA3 may be arranged in one line along a predetermined direction. The first pixel light emitting area PXA1, the second pixel light emitting area PXA2, and the third pixel light emitting area PXA3 may have the same area as or different areas from each other.

Figure 7B:
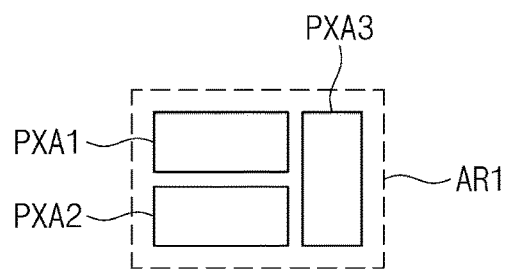

Referring to FIG. 7B, the first sub-area AR1 may include a first pixel light emitting area PXA1, a second pixel light emitting area PXA2, and a third pixel light emitting area PXA3. Each of the first pixel light emitting area PXA1, the second pixel light emitting area PXA2, and the third pixel light emitting area PXA3 may have a rectangular shape. The first pixel light emitting area PXA1 and the second pixel light emitting area PXA2 may be defined such that a length in a horizontal direction is longer than a length in a vertical direction, and the third pixel light emitting area PXA3 may be defined such that the length in the vertical direction is longer than the length in the horizontal direction.

FIGS. 7A and 7B illustrate one first sub-area AR1 including three pixel light emitting areas as a representative example, however, the present disclosure should not be limited thereto or thereby. For example, one first sub-area AR1 may include one pixel light emitting area, two pixel light emitting areas, or four or more pixel light emitting areas.

Figure 7C:
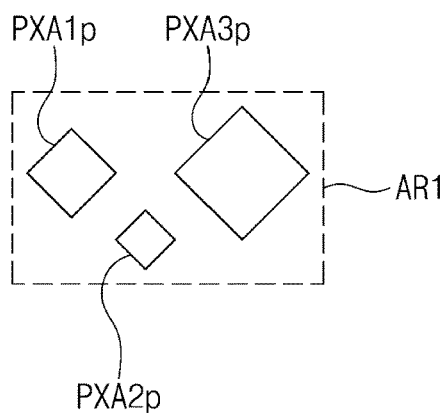

Referring to FIG. 7C, the first sub-area AR1 may include a first pixel light emitting area PXA1p, a second pixel light emitting area PXA2p, and a third pixel light emitting area PXA3p. Each of the first pixel light emitting area PXA1p, the second pixel light emitting area PXA2p, and the third pixel light emitting area PXA3p may have a lozenge shape. The first pixel light emitting area PXA1p, the second pixel light emitting area PXA2p, and the third pixel light emitting area PXA3p may have different areas from each other. The first pixel light emitting area PXA1p, the second pixel light emitting area PXA2p, and the third pixel light emitting area PXA3p may have first, second, and third areas, respectively. The first area may be larger than the second area, and the third area may be larger than the first area. The arrangement shown in FIG. 7C may be referred to as a pentile arrangement.

Figure 7D:
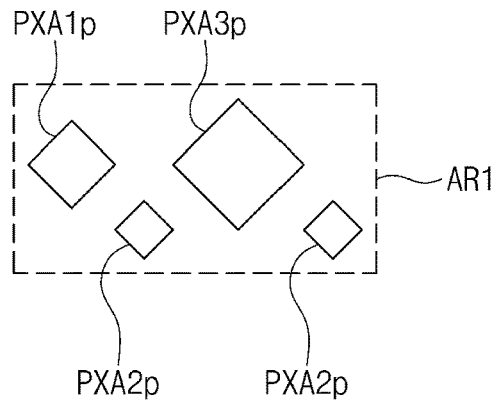

Referring to FIG. 7D, the first sub-area AR1 may include one more second pixel light emitting area PXA2p as compared with FIG. 7C.

Figure 7E:
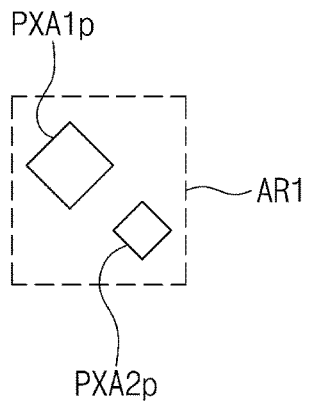

Referring to FIG. 7E, the first sub-area AR1 may not include the third pixel light emitting area PXA3p.

Figure 7F:
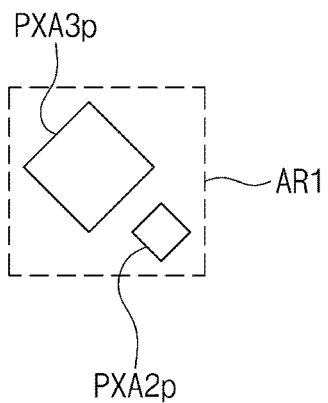

Referring to FIG. 7F, the first sub-area AR1 may not include the first pixel light emitting area PXA1p.

Figure 8:
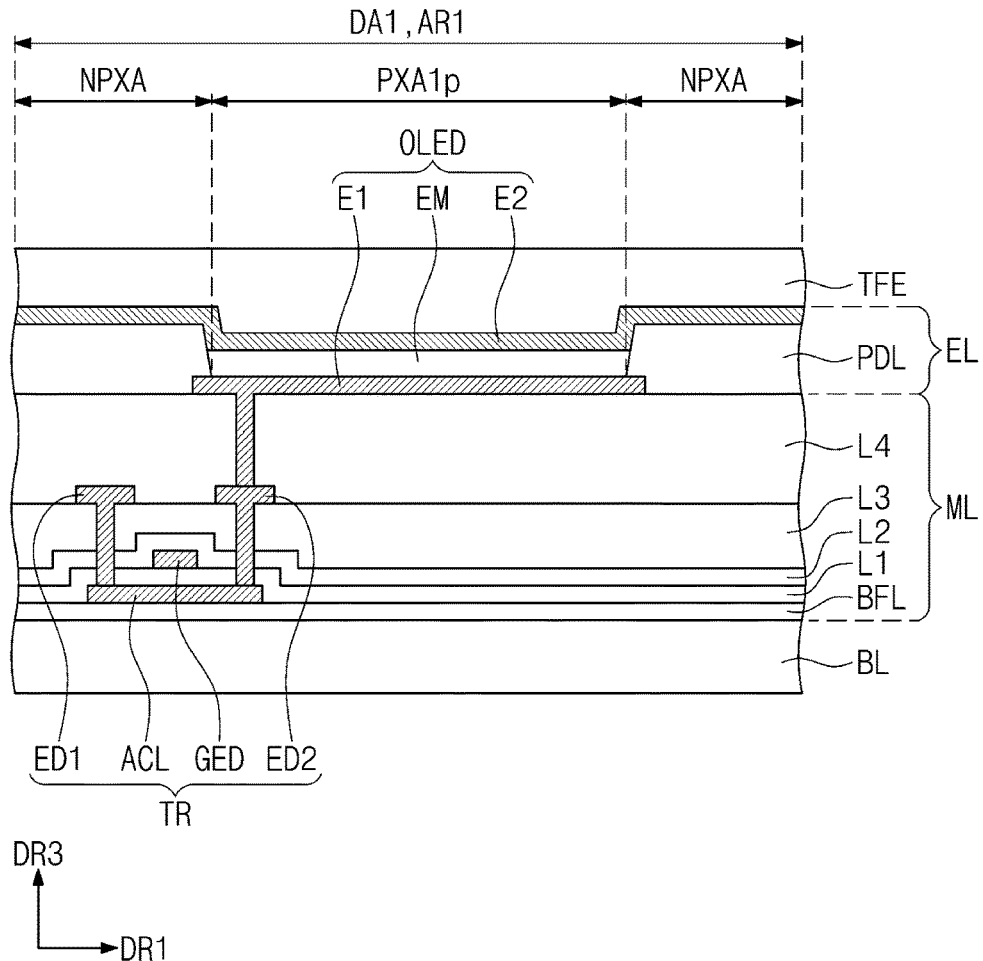
FIG. 8 is a cross-sectional view illustrating a portion of a display panel according to an exemplary embodiment.

FIG. 8 is a cross-sectional view illustrating a portion of a display panel according to an exemplary embodiment. FIG. 8 illustrates a cross-sectional view of an area where one pixel of the display panel DP (refer to FIG. 4A) is arranged. The area shown in FIG. 8 may be the first sub-area AR1. The first sub-area AR1 may be an area included in the first display area DA1 or the second display area DA2.

Referring to FIGS. 4A and 8, each of the pixels PX may include a light emitting element OLED and the pixel circuit. The pixel circuit may include the transistors TR, the signal lines GL, DL, PL, and ECL, and the capacitor. FIG. 8 illustrates only one transistor TR. The pixel light emitting area may be defined in each of the pixels PX, and one first pixel light emitting area PXA1p is shown in FIG. 8. The first sub-area AR1 may include the first pixel light emitting area PXA1p and a non-light emitting area NPXA. The non-light emitting area NPXA may surround the first pixel light emitting area PXA1p.

The display panel DP may include a base layer BL, a circuit layer ML, a light emitting element layer EL, and an encapsulation layer TFE. The circuit layer ML may include a transistor TR and a plurality of insulating layers BFL, L1, L2, L3, and L4.

The insulating layer BFL may be disposed on the base layer BL, and the transistor TR may be disposed on the insulating layer BFL. The transistor TR may include a semiconductor layer ACL, a control electrode GED, a first electrode ED1, and a second electrode ED2.

The semiconductor layer ACL may be disposed on the insulating layer BFL. The insulating layer BFL may be a buffer layer that provides a modified surface to the semiconductor layer ACL. In this case, the semiconductor layer ACL may have a higher adhesive strength with respect to the insulating layer BFL than the base layer BL. In addition, the insulating layer BFL may be a barrier layer that protects a lower surface of the semiconductor layer ACL. In this case, the insulating layer BFL may prevent or suppress the base layer BL itself or contaminant or moisture entering through the base layer BL from infiltrating into the semiconductor layer ACL. As another example, the insulating layer BFL may be a light blocking layer that blocks the external light entering through the base layer BL from being incident into the semiconductor layer ACL. In this case, the insulating layer BFL may further include a light blocking material.

The semiconductor layer ACL may include polysilicon or amorphous silicon. Further, the semiconductor layer ACL may include a metal oxide semiconductor. The semiconductor layer ACL may include a channel area acting as a path through which electrons or holes move and first and second ion doping areas that are disposed with the channel area interposed therebetween.

A first insulating layer L1 may be disposed on the insulating layer BFL to cover the semiconductor layer ACL. The first insulating layer L1 may include an inorganic material. The inorganic material may include at least one of silicon nitride, silicon oxynitride, silicon oxide, titanium oxide, and aluminum oxide.

The control electrode GED may be disposed on the first insulating layer L1. A second insulating layer L2 may be disposed on the first insulating layer L1 to cover the control electrode GED. The second insulating layer L2 may include an inorganic material.

A third insulating layer L3 may be disposed on the second insulating layer L2. The first electrode ED1 and the second electrode ED2 may be disposed on the third insulating layer L3. The first electrode ED1 and the second electrode ED2 may be connected to the semiconductor layer ACL via contact holes defined through the first insulating layer L1, the second insulating layer L2, and the third insulating layer L3.

A fourth insulating layer L4 may be disposed on the third insulating layer L3 to cover the first electrode ED1 and the second electrode ED2. The fourth insulating layer L4 may have a single- or multi-layer structure. For example, the single-layer structure may include an organic layer. The multi-layer structure may include an organic layer and an inorganic layer, which are stacked one on another. The fourth insulating layer L4 may be a planarization layer that provides a flat surface thereabove.

A light emitting element layer EL and the pixel definition layer PDL may be disposed on the fourth insulating layer L4.

The light emitting element layer EL may include the light emitting element OLED and the pixel definition layer PDL. The light emitting element OLED may include a first electrode E1, a light emitting layer EM, and a second electrode E2. The first electrode E1 may be disposed on the fourth insulating layer L4 and may be electrically connected to the second electrode ED2 via a contact hole defined through the fourth insulating layer L4. The light emitting element OLED may correspond to the light emitting element EE described in FIG. 4B.

The pixel definition layer PDL may be disposed on the circuit layer ML to define the first pixel light emitting area PXA1$p$. The pixel definition layer PDL may cover at least a portion of the first electrode E1 and may be disposed on the fourth insulating layer L4. The portion of the first electrode E1 may not be covered by the pixel definition layer PDL and may correspond to the first pixel light emitting area PXA1$p$.

The light emitting layer EM may be disposed between the first electrode E1 and the second electrode E2. The light emitting layer EM may have a single-layer structure of a single material, a single-layer structure of plural different materials, or a multi-layer structure of plural different materials.

The light emitting layer EM may include an organic material. The organic material should not be particularly limited as long as it is a commonly used material. For example, the light emitting layer EM may include at least one material among materials emitting a red, green, or blue light and may include a fluorescent material or a phosphorescent material.

The second electrode E2 may be disposed on the light emitting layer EM and the pixel definition layer PDL. The second electrode E2 may receive the second power voltage.

The encapsulation layer TFE may be disposed on the second electrode E2. The encapsulation layer TFE may directly cover the second electrode E2. According to another exemplary embodiment, a capping layer may be further disposed between the encapsulation layer TFE and the second electrode E2 to cover the second electrode E2. In this case, the encapsulation layer TFE may directly cover the capping layer. The capping layer may include an organic material. The capping layer may protect the second electrode E2 from a subsequent process, such as a sputtering process, and may improve a light emitting efficiency of the light emitting element layer EL.

The encapsulating layer TFE may include an organic layer and an inorganic layer, the inorganic layer may protect the light emitting element OLED from moisture and oxygen, and the organic layer may protect the light emitting element OLED from a foreign substance such as a dust particle.

Figure 9:
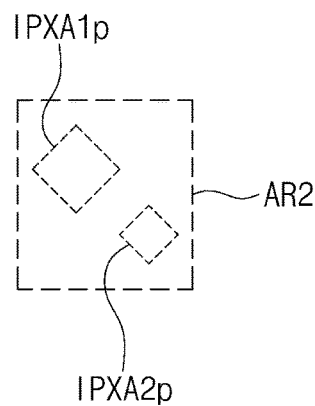
FIG. 9 is an enlarged plan view illustrating a portion of FIG. 6A.

FIG. 9 is an enlarged plan view illustrating a portion of FIG. 6A.

FIG. 9 is a plan view illustrating the dummy pixel area of the second sub-area AR2. The dummy pixel area does not provide the image. For the convenience of explanation, the dummy pixel area corresponding to the pixel light emitting area is represented by a dotted line.

For example, the second sub-area AR2 may include a first dummy pixel area IPXA1$p$ and a second dummy pixel area IPXA2$p$. The first and second dummy pixel areas IPXA1$p$ and IPXA2$p$ may respectively correspond to the first and second pixel light emitting areas PXA1$p$ and PXA2$p$ of the first sub-area AR1 shown in FIG. 7E.

Referring to FIG. 5, the first display area DA1 (refer to FIG. 4A) includes a plurality of first sub-areas AR1. One first sub-area AR1 may include the second pixel light emitting area PXA2$p$ and the third pixel light emitting area PXA3$p$ as shown in FIG. 7F. Another first sub-area AR1 disposed adjacent to the one first sub-area AR1 in the first direction DR1 may include the first pixel light emitting area PXA1$p$ and the second pixel light emitting area PXA2$p$ as shown in FIG. 7E.

The second display area DA2 (refer to FIG. 4A) may include the first sub-area AR1 and the second sub-area AR2.

The second sub-area AR2 may be the area including the dummy pixel, i.e., the area which does not include the pixel. That is, the second sub-area AR2 may be an area in which the first pixel light emitting area PXA1$p$ and the second pixel light emitting area PXA2$p$ of FIG. 7E are changed to the dummy pixel areas.

Figure 10A:
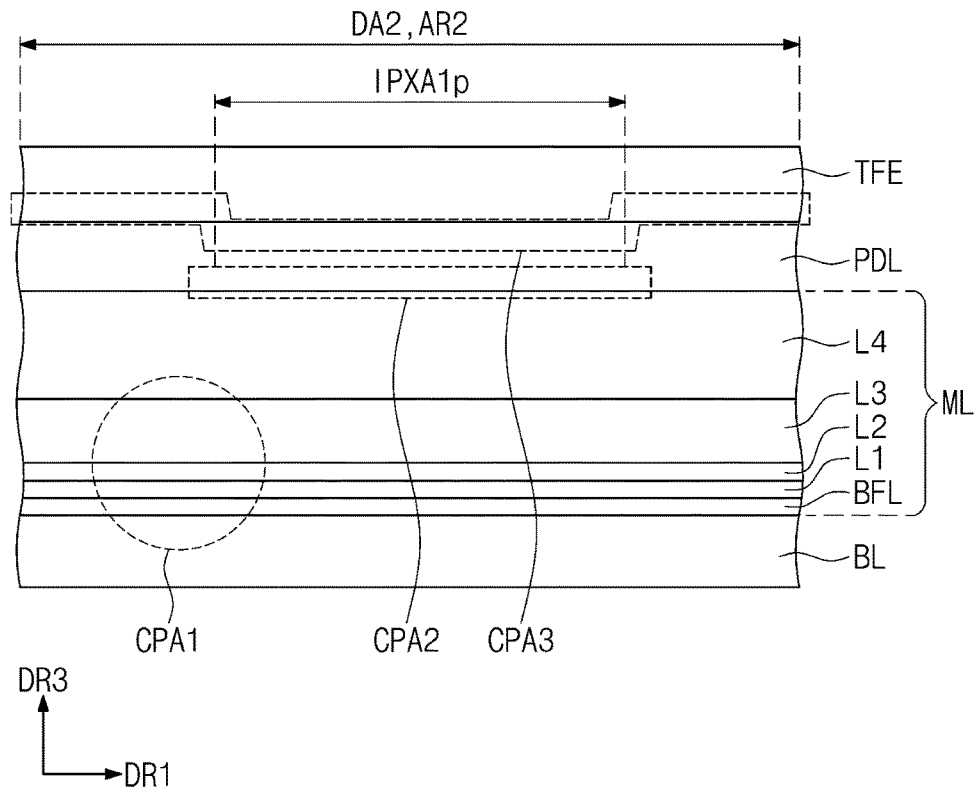
FIG. 10A is a cross-sectional view illustrating a portion of a display panel according to an exemplary embodiment.
Figure 10B:
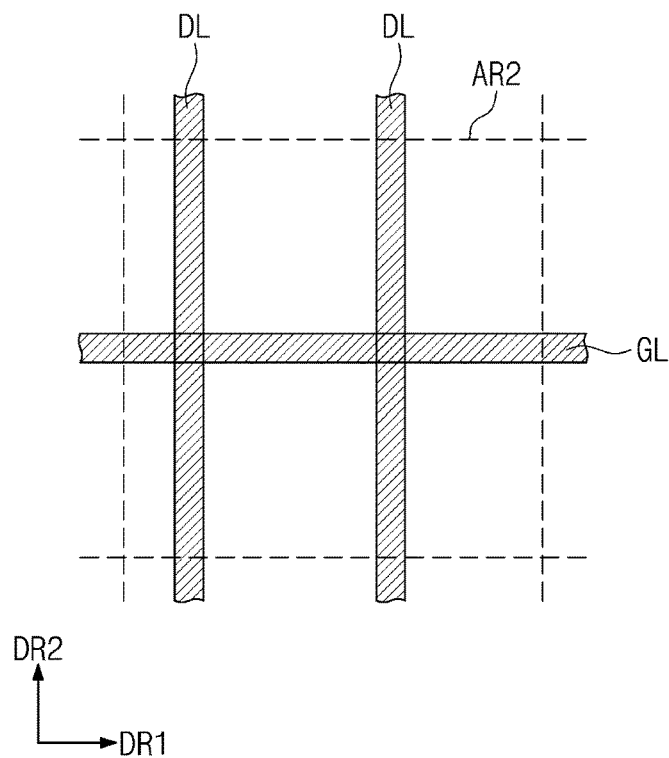
FIG. 10B is a plan view illustrating a portion of a display panel according to an exemplary embodiment.
Figure 10C:
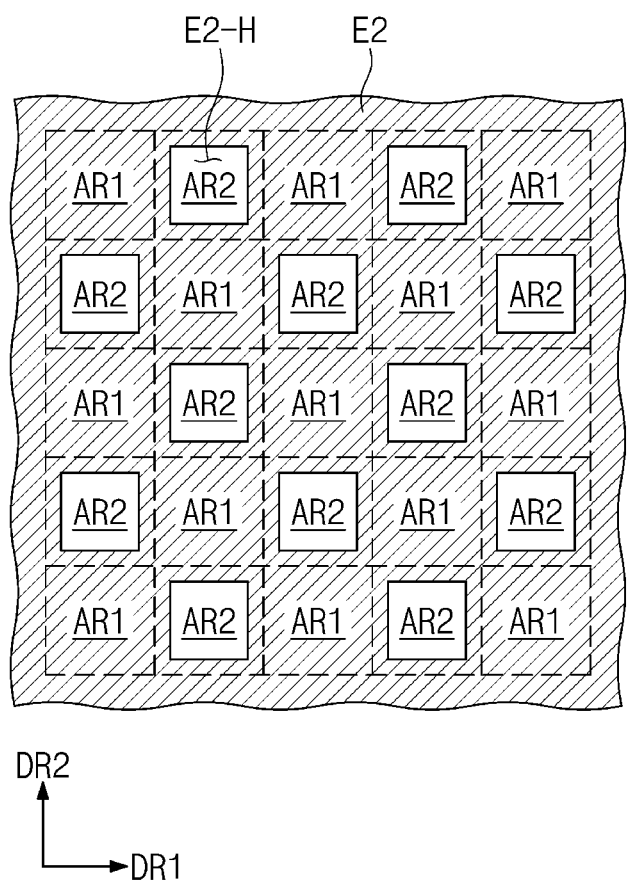
FIG. 10C is a plan view illustrating a portion of a display panel according to an exemplary embodiment.

FIG. 10A is a cross-sectional view illustrating a portion of a display panel according to an exemplary embodiment. FIG. 10B is a plan view illustrating a portion of a display panel according to an exemplary embodiment. FIG. 10C is a plan view illustrating a portion of a display panel according to an exemplary embodiment.

An area illustrated in FIG. 10A may be the second sub-area AR2. The second sub-area AR2 may be an area included in the second display area DA2 (refer to FIG. 4A).

Referring to FIGS. 8 and 10A, the dummy pixel may be disposed in the second sub-area AR2. The dummy pixel may be the pixel from which at least one of the first electrode E1, the light emitting layer EM, the second electrode E2, and the transistor TR is omitted.

FIG. 10A illustrates the first dummy pixel area IPXA1$p$ corresponding to the first pixel light emitting area PXA1$p$ of FIG. 8. In addition, FIG. 10A illustrates a first area CPA1 from which the transistor TR is omitted, a second area CPA2 from which the first electrode E1 is omitted, and a third area CPA3 from which the second electrode E2 is omitted.

The dummy pixel of FIG. 10A may be the pixel from which the first electrode E1, the light emitting layer EM, the second electrode E2, and the transistor TR are omitted. When viewed in a plan view, the dummy pixel may have a structure in which a metal layer is omitted as compared with the pixel. Accordingly, a reflectance of the dummy pixel may be lower than the reflectance of the pixel. In addition, a transmittance of the dummy pixel may be higher than the transmittance of the pixel.

FIG. 10B illustrates a plan view of the second sub-area AR2. Referring to FIG. 10B, the first electrode E1, the light emitting layer EM, the second electrode E2, and the transistor TR may be removed from the second sub-area AR2. However, since the first sub-area AR1 is disposed around the second sub-area AR2, lines transmitting signals to the first sub-area AR1 may be disposed in the second sub-area AR2. For example, the signal lines may be disposed in the second sub-area AR2. FIG. 10B illustrates only the scan line GL and the data line DL among the signal lines as a representative example.

FIG. 10C shows the first sub-areas AR1, the second sub-areas AR2, and the second electrode E2. The second electrode E2 may be disposed throughout the active area AA (refer to FIG. 4A). The second electrode E2 may receive a common voltage.

Openings E2-H may be defined in areas of the second electrode E2, which overlap with the second sub-areas AR2. The openings E2-H may be defined by removing portions of the second electrode E2.

The openings E2-H may be formed in the second electrode E2 using various processes. For example, the openings E2-H may be formed using a stamping process or a laser drilling process. In addition, the second electrode E-2 through which the openings E2-H are defined may be formed using a plurality of mask processes. Various processes may be used as the processes of forming the openings E2-H other than the above-mentioned processes.

Figure 11:
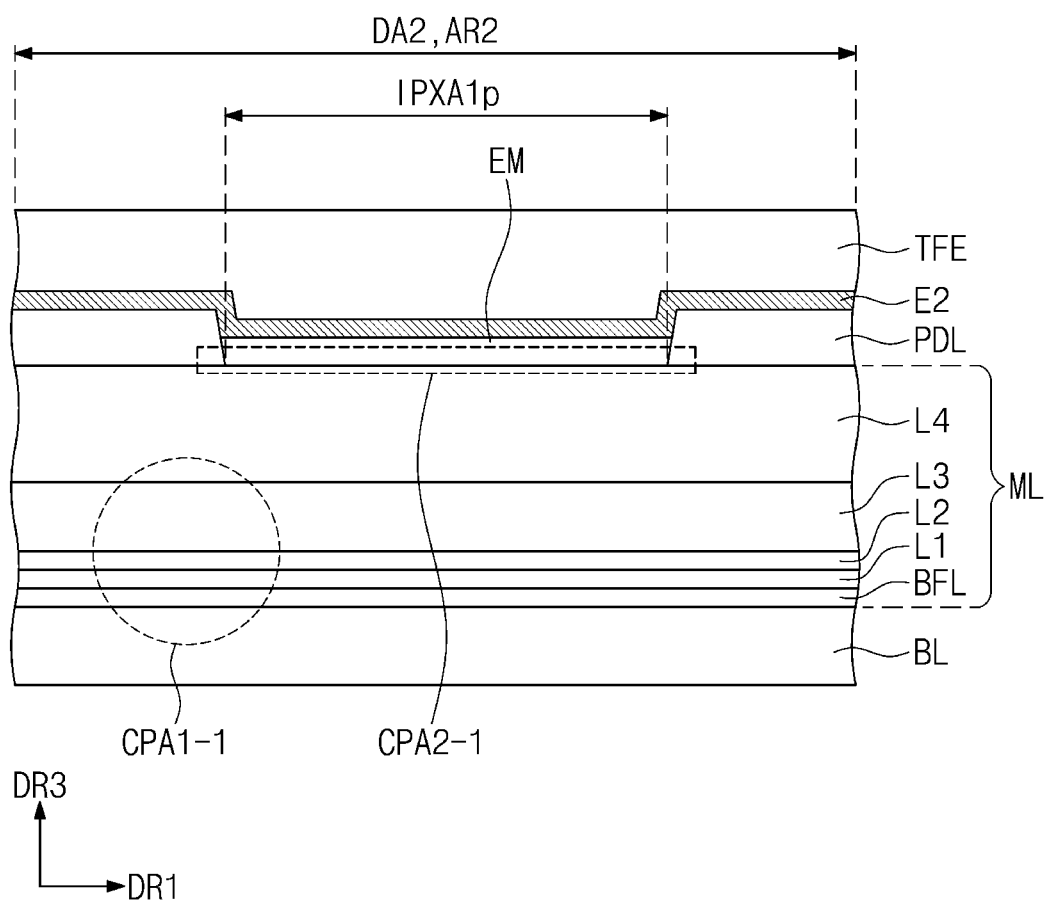
FIG. 11 is a cross-sectional view illustrating a portion of a display panel according to an exemplary embodiment.

FIG. 11 is a cross-sectional view illustrating a portion of a display panel according to an exemplary embodiment.

Referring to FIGS. 8 and 11, the dummy pixel may be disposed in the second sub-area AR2. FIG. 11 illustrates the first dummy pixel area IPXA1p corresponding to the first pixel light emitting area PXA1p of FIG. 8. In addition, a first area CPA1-1 from which the transistor TR is omitted and a second area CPA2-1 from which the first electrode E1 is omitted are shown. The dummy pixel shown in FIG. 11 may include the light emitting layer EM and the second electrode E2. However, since some components among components required to allow the pixel to emit the light are omitted from the dummy pixel, the dummy pixel may not provide the light. In addition, the transmittance of the dummy pixel may be improved and the reflectance of the dummy pixel may be reduced by omitting the first electrode E1.

Figure 12A:
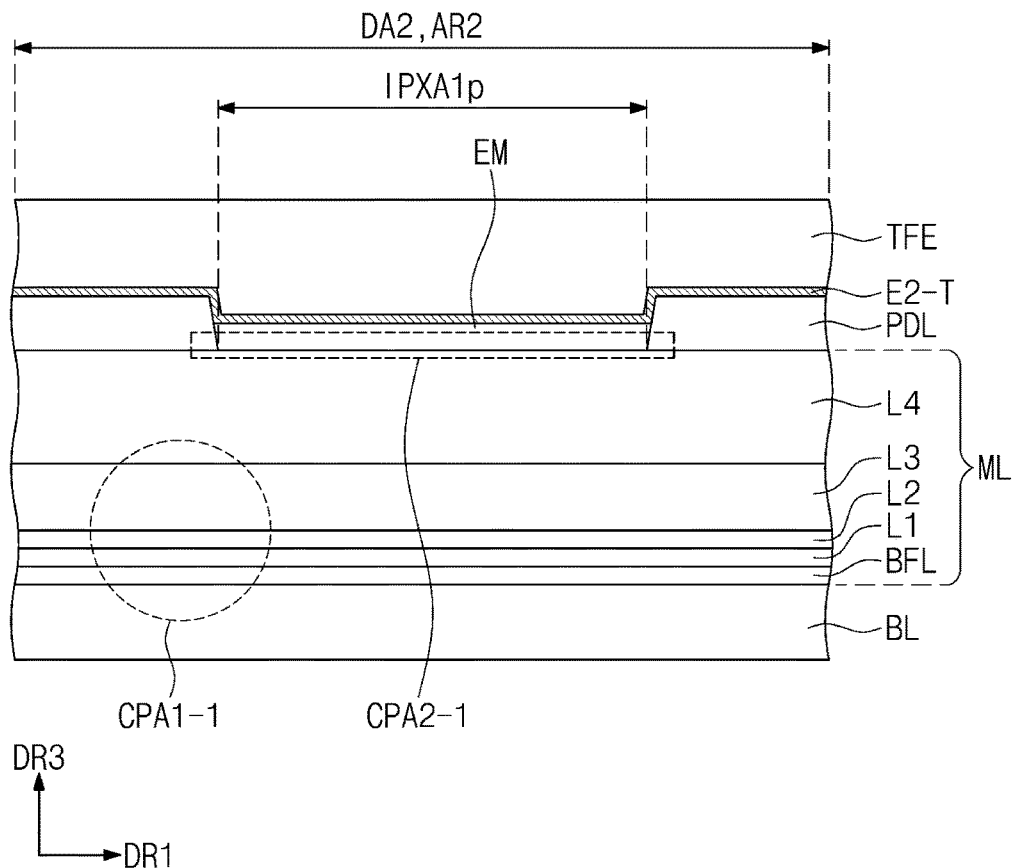
FIG. 12A is a cross-sectional view illustrating a portion of a display panel according to an exemplary embodiment.
Figure 12B:
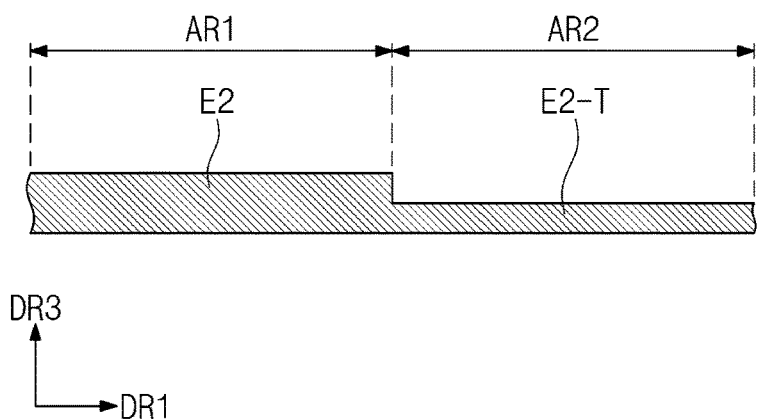
FIG. 12B is a cross-sectional view illustrating a portion of a display panel according to an exemplary embodiment.

FIG. 12A is a cross-sectional view illustrating a portion of a display panel according to an exemplary embodiment. FIG. 12B is a cross-sectional view illustrating a portion of a display panel according to an exemplary embodiment.

In the descriptions on FIGS. 12A and 12B, different features from FIG. 11 will be mainly described. The second electrode may include a first electrode portion E2 and a second electrode portion E2-T. The first electrode portion E2 may have a first thickness, and the second electrode portion E2-T may have a second thickness. The first thickness may be larger than the second thickness.

The first electrode portion E2 may be disposed in the first display area DA1 (refer to FIG. 4A), and the second electrode portion E2-T may be disposed in the second display area DA2.

In the exemplary embodiment, the second electrode portion E2-T may be disposed throughout the second display area DA2. In the exemplary embodiment, the second electrode portion E2-T may be disposed only in the second sub-area AR2 of the second display area DA2.

The first electrode portion E2 may include a plurality of metal layers, and the second electrode portion E2-T may include a smaller number of metal layers than the first electrode portion E2. For example, the first electrode portion E2 may include two metal layers, and the second electrode portion E2-T may include one metal layer.

In the exemplary embodiment, each of the first electrode portion E2 and the second electrode portion E2-T may include a single metal layer, and a thickness of the first electrode portion E2 may be different from a thickness of the second electrode portion E2-T.

Figure 13:
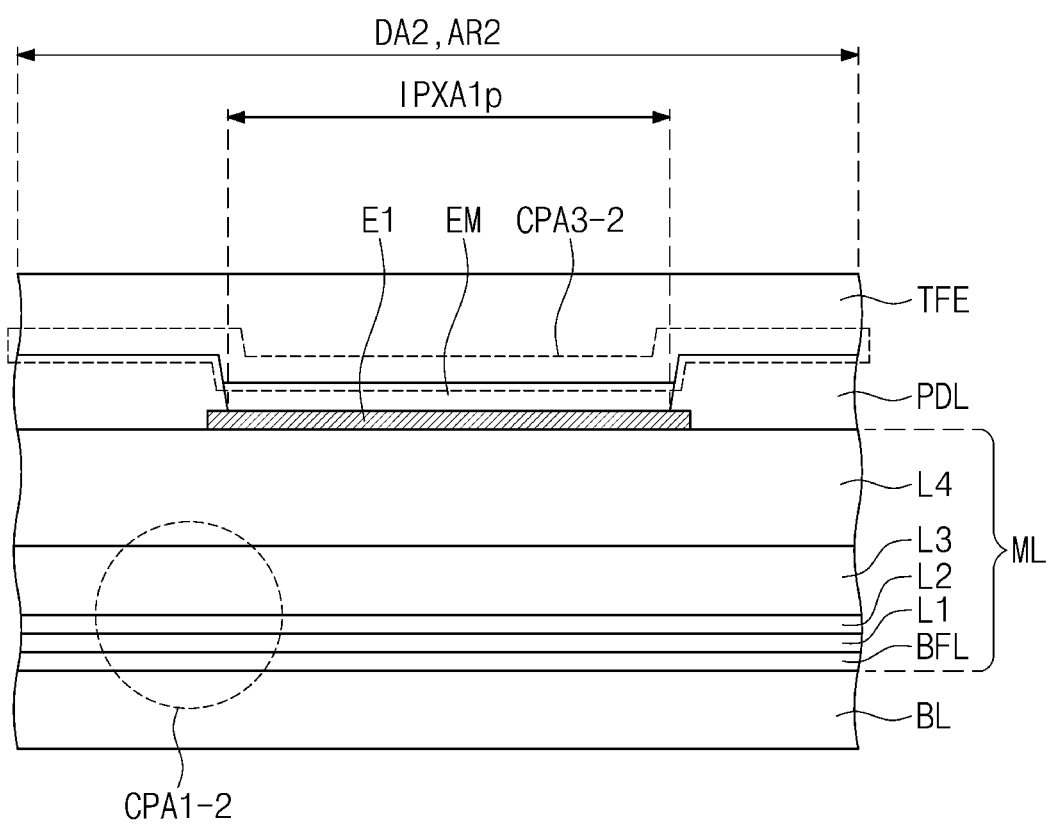
FIG. 13 is a cross-sectional view illustrating a portion of a display panel according to an exemplary embodiment.

FIG. 13 is a cross-sectional view illustrating a portion of a display panel according to an exemplary embodiment.

Referring to FIGS. 8 and 13, the dummy pixel may be disposed in the second sub-area AR2. FIG. 13 illustrates the first dummy pixel area IPXA1p corresponding to the first pixel light emitting area PXA1p of FIG. 8. In addition, a first area CPA1-2 from which the transistor TR is omitted and a third area CPA3-2 from which the second electrode E2 is omitted are shown. The dummy pixel shown in FIG. 13 may include the light emitting layer EM and the first electrode E1. However, since some components among components required to allow the pixel to emit the light are omitted from the dummy pixel, the dummy pixel may not provide the light. In addition, the transmittance of the dummy pixel may be improved and the reflectance of the dummy pixel may be reduced by omitting the second electrode E2.

Figure 14:
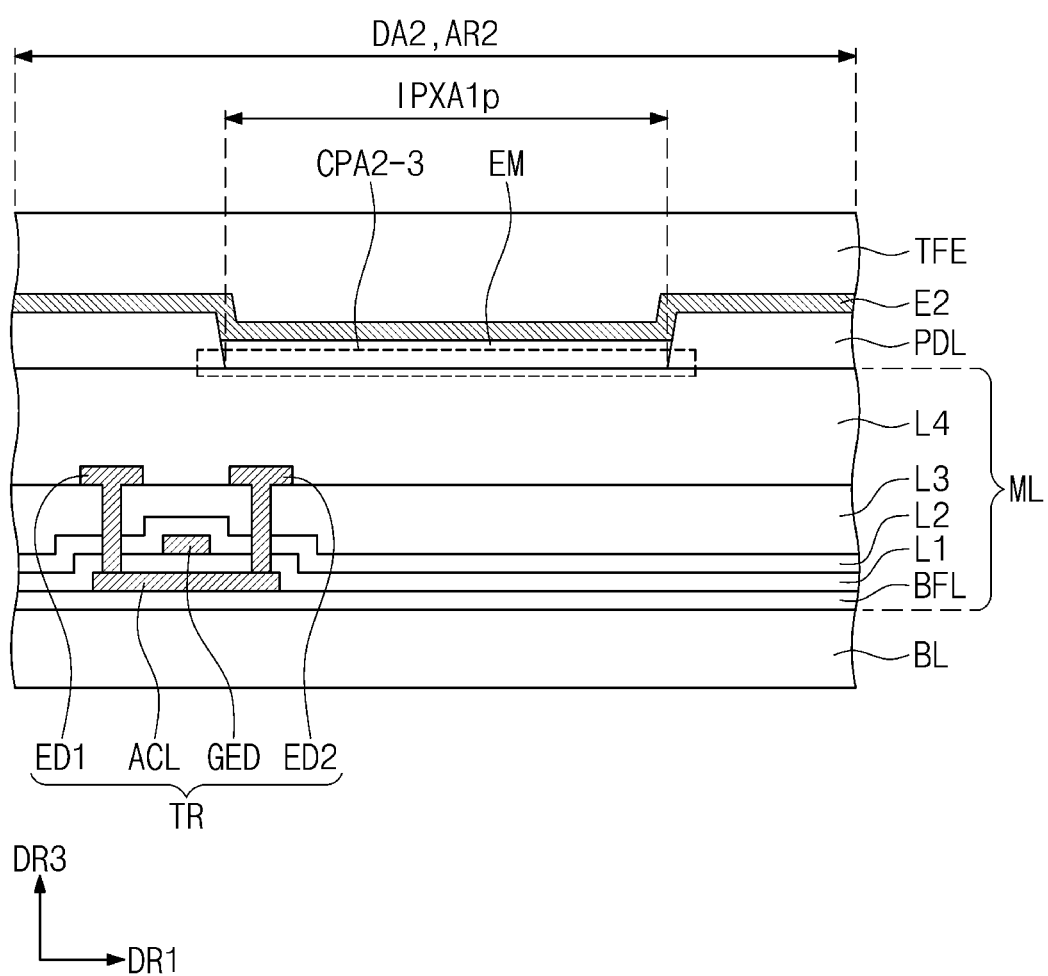
FIG. 14 is a cross-sectional view illustrating a portion of a display panel according to an exemplary embodiment.

FIG. 14 is a cross-sectional view illustrating a portion of a display panel according to an exemplary embodiment.

Referring to FIGS. 8 and 14, the dummy pixel may be disposed in the second sub-area AR2. FIG. 14 illustrates the first dummy pixel area IPXA1p corresponding to the first pixel light emitting area PXA1p of FIG. 8. In addition, a second area CPA2-3 from which the first electrode E1 is omitted is shown. The dummy pixel shown in FIG. 14 may include the transistor TR, the light emitting layer EM, and the second electrode E2. However, since some components among components required to allow the pixel to emit the light are omitted from the dummy pixel, the dummy pixel may not provide the light.

Figure 15:
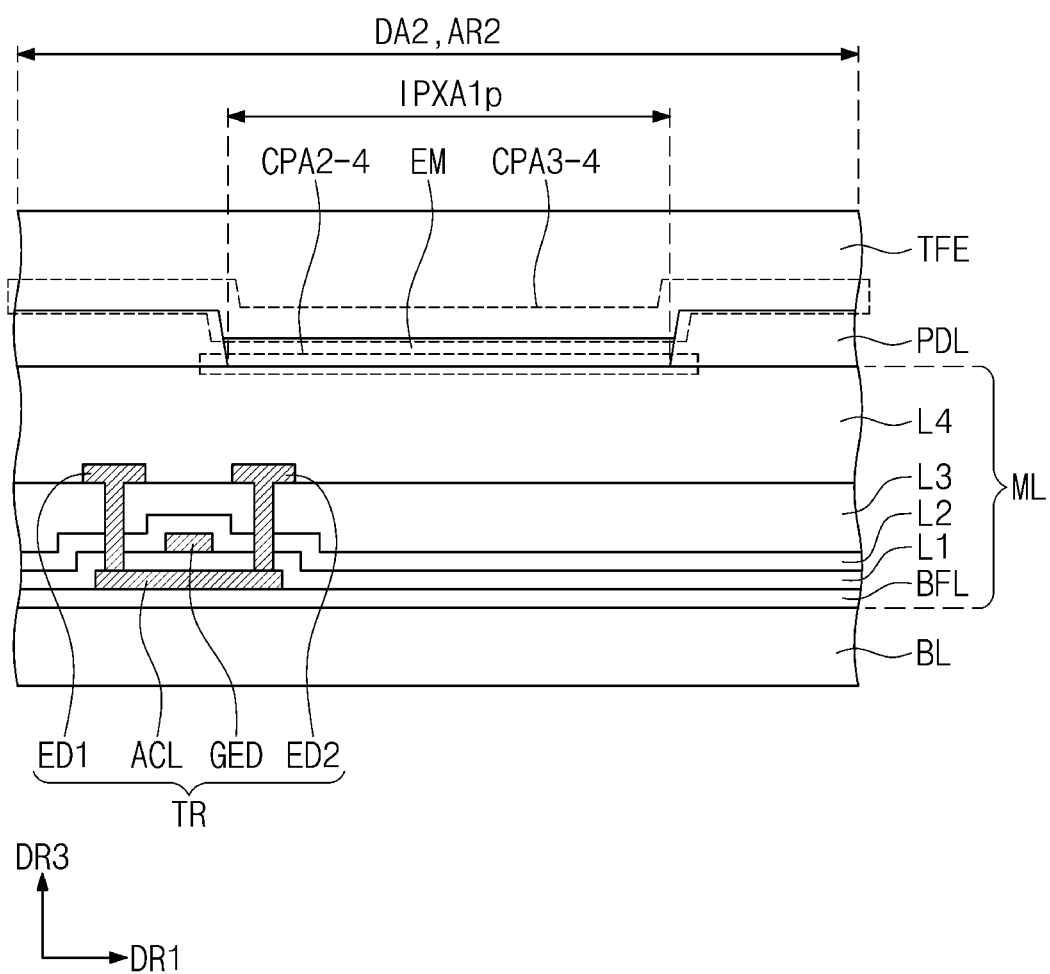
FIG. 15 is a cross-sectional view illustrating a portion of a display panel according to an exemplary embodiment.

FIG. 15 is a cross-sectional view illustrating a portion of a display panel according to an exemplary embodiment.

Referring to FIGS. 8 and 15, the dummy pixel may be disposed in the second sub-area AR2. FIG. 15 illustrates the first dummy pixel area IPXA1p corresponding to the first pixel light emitting area PXA1p of FIG. 8. In addition, a second area CPA2-4 from which the first electrode E1 is omitted and a third area CPA3-4 from which the second electrode E2 is omitted are shown. The dummy pixel shown in FIG. 15 may include the transistor TR. However, since some components among components required to allow the pixel to emit the light are omitted from the dummy pixel, the dummy pixel may not provide the light.

Figure 16:
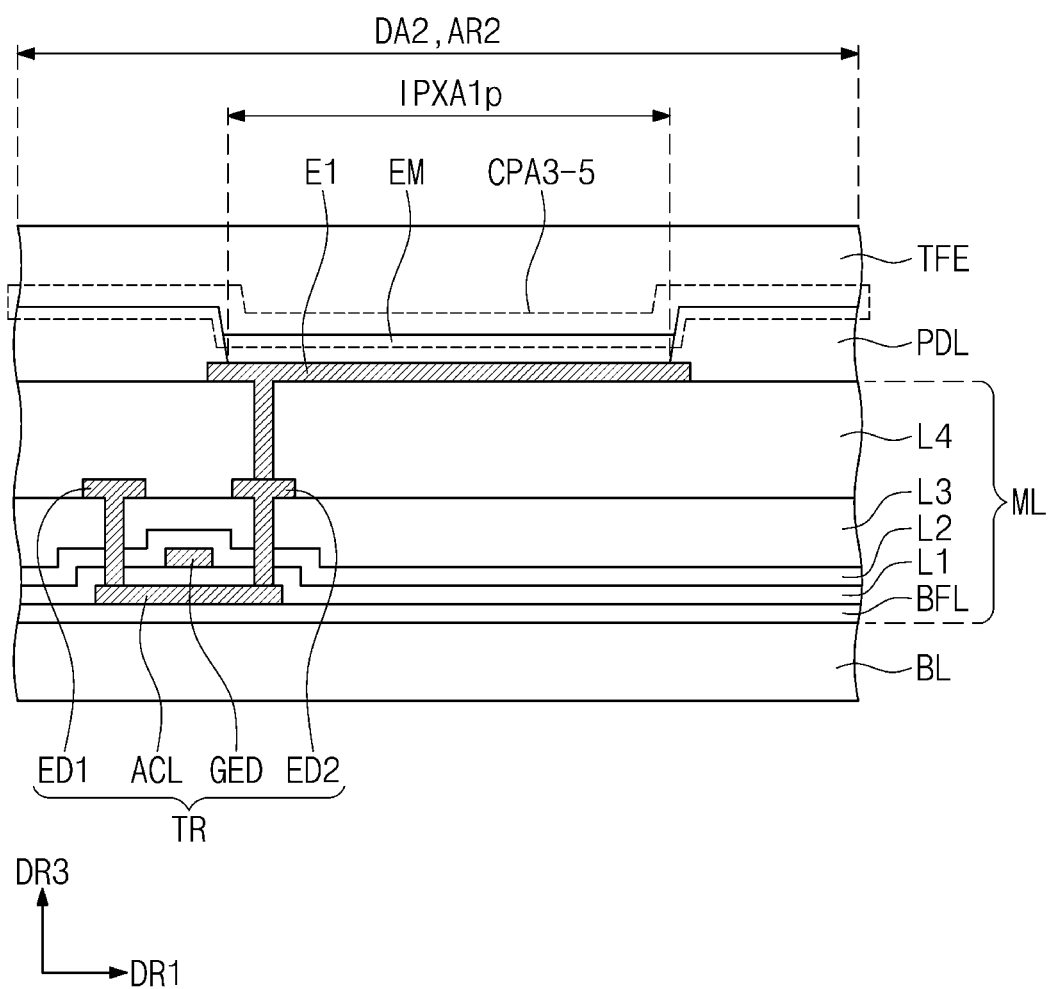
FIG. 16 is a cross-sectional view illustrating a portion of a display panel according to an exemplary embodiment.

FIG. 16 is a cross-sectional view illustrating a portion of a display panel according to an exemplary embodiment.

Referring to FIGS. 8 and 16, the dummy pixel may be disposed in the second sub-area AR2. FIG. 16 illustrates the first dummy pixel area IPXA1p corresponding to the first pixel light emitting area PXA1p of FIG. 8. In addition, a third area CPA3-5 from which the second electrode E2 is omitted is shown. The dummy pixel shown in FIG. 16 may include the transistor TR, the light emitting layer EM, and the first electrode E1. However, since some components among components required to allow the pixel to emit the light are omitted from the dummy pixel, the dummy pixel may not provide the light.

Figure 17A:
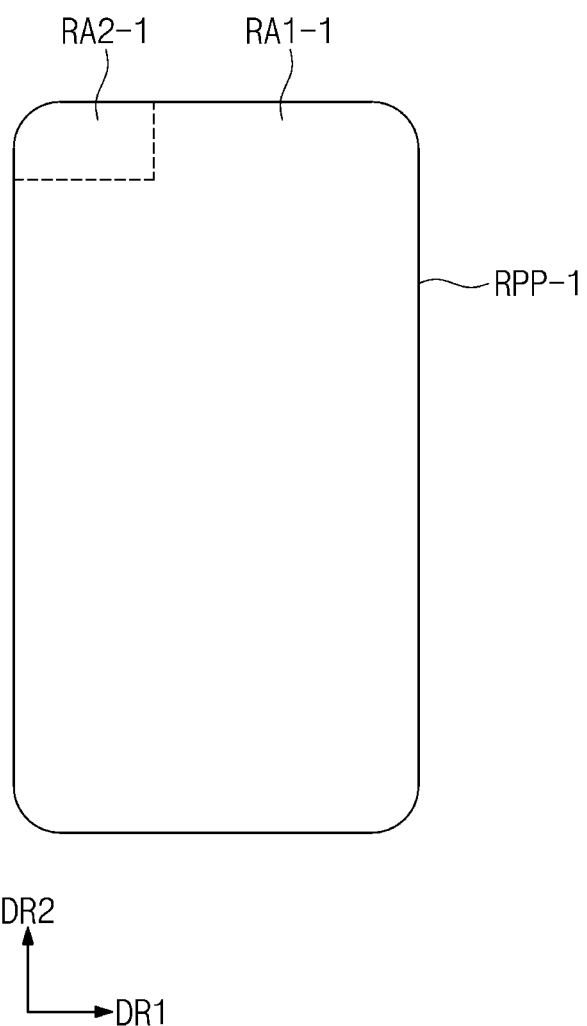
FIG. 17A is a plan view illustrating an anti-reflective panel according to an exemplary embodiment.
Figure 17B:
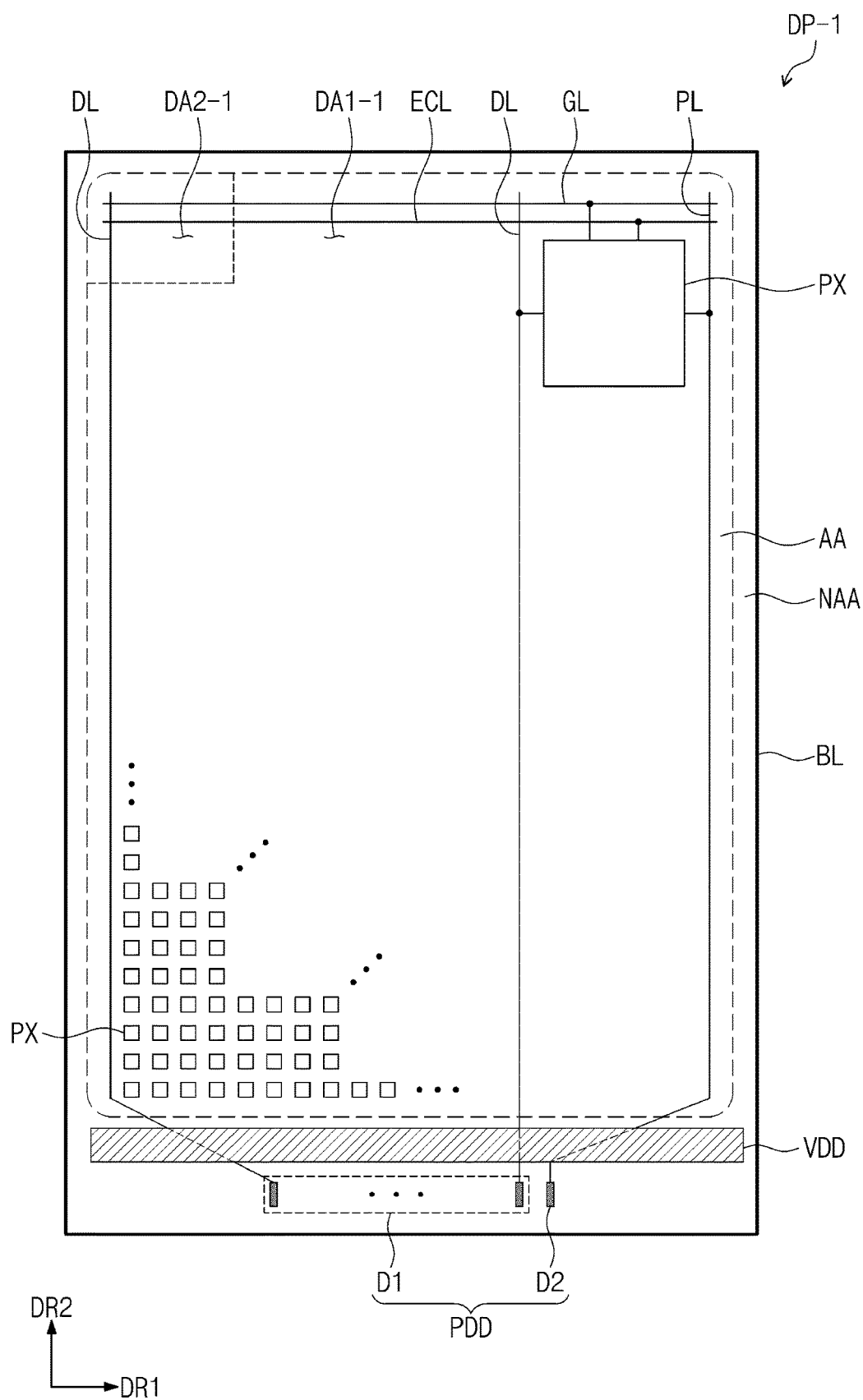
FIG. 17B is a plan view illustrating a display panel according to an exemplary embodiment.

FIG. 17A is a plan view illustrating an anti-reflective panel RPP-1 according to an exemplary embodiment. FIG. 17B is a plan view illustrating a display panel DP-1 according to an exemplary embodiment.

Referring to FIG. 17A, the anti-reflective panel RPP-1 may include a first area RA1-1 and a second area RA2-1. The first area RA1-1 may have a first transmittance, and the second area RA2-1 may have a second transmittance higher than the first transmittance. According to the exemplary embodiment, since the transmittance of the area overlapping with the electronic module SS (refer to FIG. 1B) is improved, the sensing sensitivity of the electronic module SS may be more improved.

Various treatments may be applied to the second area RA2-1 of the anti-reflective panel RPP-1 to improve the transmittance of the second area RA2-1. For instance, the second area RA2-1 of the anti-reflective panel RPP-1 may be decolored or removed.

The second area RA2-1 may be defined to be adjacent to an edge of the anti-reflective panel RPP-1. For example, the anti-reflective panel RPP-1 may have a quadrangular shape with a curvature at each of vertices of the anti-reflective panel RPP-1. The second area RA2-1 may include at least one of sides having the curvature.

The first area RA1-1 may surround the second area RA2-1. A boundary between the first area RA1-1 and the second area RA2-1 may include at least one side. FIG. 17A shows an example in which the boundary includes two sides.

Referring to FIG. 17B, a first display area DA1-1 and a second display area DA2-1 may be defined in the display panel DP-1. The first display area DA1-1 may overlap with the first area RA1-1 when viewed in a plan view, and the second display area DA2-1 may overlap with the second area RA2-1 when viewed in a plan view.

The first display area DA1-1 may have a resolution higher than a resolution of the second display area DA2-1. In addition, the first display area DA1-1 may have a reflectance higher than a reflectance of the second display area DA2-1.

An external light reflection suppressing performance of the second area RA2-1 may be slightly less than an external light reflection suppressing performance of the first area RA1-1. However, according to the exemplary embodiment, although the external light reflection suppressing performance of the second area RA2-1 is reduced, the external light reflection suppressing performance of the second area RA2-1 may be compensated by reducing the reflectance of the second display area DA2-1. The external light reflection suppressing performance may be compensated by controlling the resolution and/or the reflectance of the first and second display areas DA1-1 and DA2-1 of the display panel DP-1.

Figure 18A:
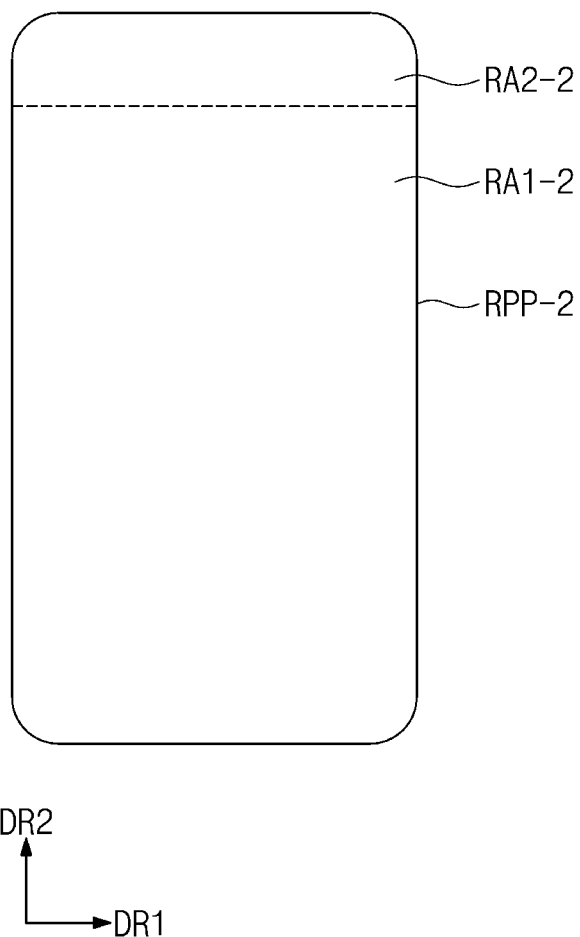
FIG. 18A is a plan view illustrating an anti-reflective panel according to an exemplary embodiment.
Figure 18B:
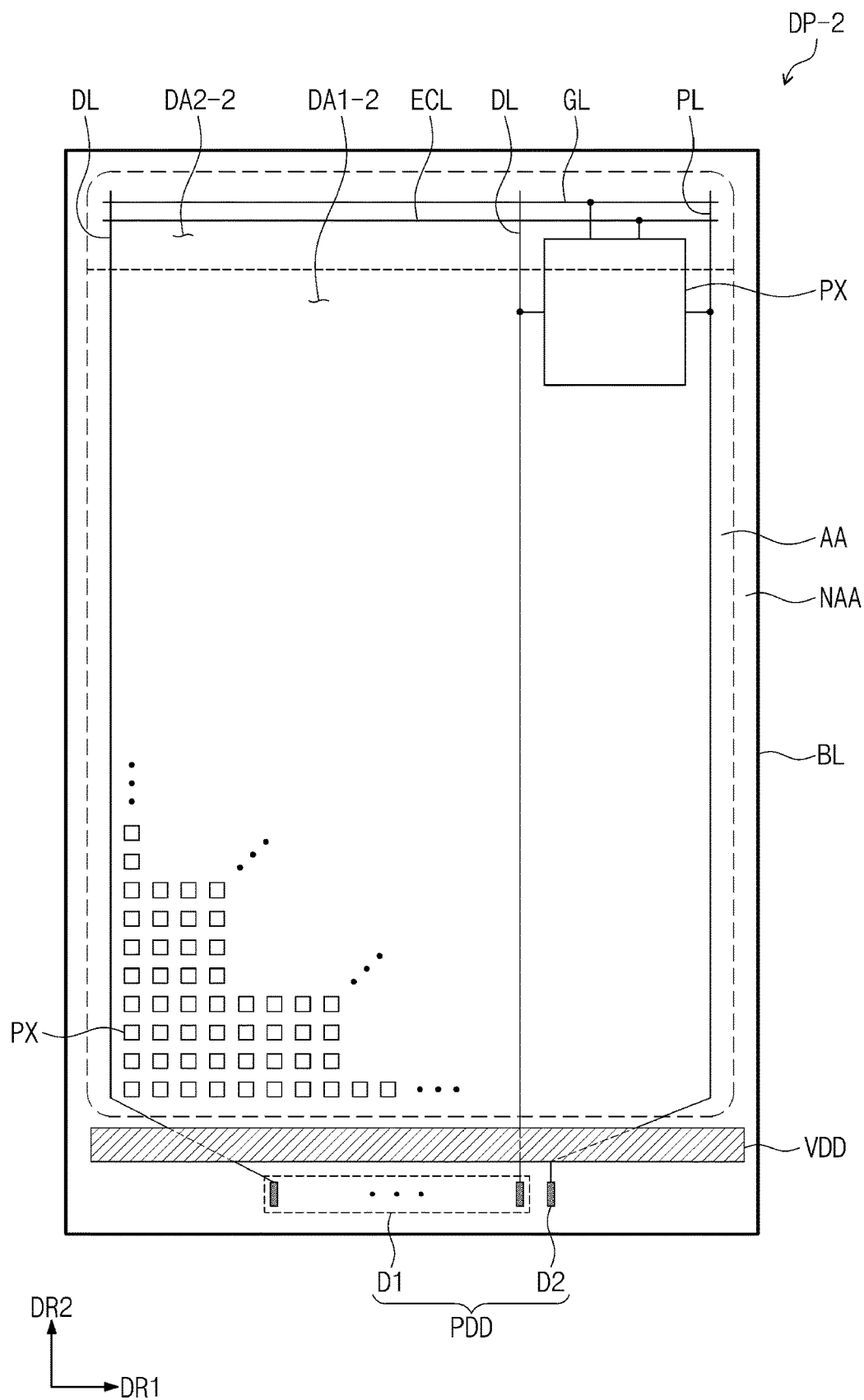
FIG. 18B is a plan view illustrating a display panel according to an exemplary embodiment.

FIG. 18A is a plan view illustrating an anti-reflective panel RPP-2 according to an exemplary embodiment. FIG. 18B is a plan view illustrating a display panel DP-2 according to an exemplary embodiment.

Referring to FIG. 18A, the anti-reflective panel RPP-2 may include a first area RA1-2 and a second area RA2-2. The first area RA1-2 may have a first transmittance, and the second area RA2-2 may have a second transmittance higher than the first transmittance. According to the exemplary embodiment, since the transmittance of the area overlapping with the electronic module SS (refer to FIG. 1B) is improved, the sensing sensitivity of the electronic module SS may be more improved.

The second area RA2-2 may be defined to be adjacent to an edge of the anti-reflective panel RPP-2. For example, the anti-reflective panel RPP-2 may have a quadrangular shape with a curvature at each of vertices of the anti-reflective panel RPP-2. The second area RA2-2 may include at least two of sides having the curvature.

Referring to FIG. 18B, a first display area DA1-2 and a second display area DA2-2 may be defined in the display panel DP-2. The first display area DA1-2 may overlap with the first area RA1-2 when viewed in a plan view, and the second display area DA2-2 may overlap with the second area RA2-2 when viewed in a plan view.

The first display area DA1-2 may have a resolution higher than a resolution of the second display area DA2-2. In addition, the first display area DA1-2 may have a reflectance higher than a reflectance of the second display area DA2-2.

According to the above, the display device includes the anti-reflector in which the first and second areas having different transmittances from each other are defined and the display panel in which the first and second display areas having different resolutions or reflectances from each other are defined. The second area of the anti-reflector overlapping with the electronic module when viewed in a plan view may have the transmittance higher than that of the first area. Accordingly, the sensing sensitivity of the electronic module may be more improved.

In addition, although the external light reflection suppressing performance is reduced as the transmittance of the second area is improved, the external light reflection suppressing performance may be compensated by controlling the resolution and/or the reflectance of the second display area of the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a window;
an anti-reflector disposed under the window, the anti-reflector comprising:
a first area having a first transmittance; and
a second area having a second transmittance higher than the first transmittance; and
a display panel disposed under the anti-reflector, the display panel comprising:
a first display area having a first resolution;
a second display area having a second resolution lower than the first resolution; and
a plurality of pixels disposed in the first display area and the second display area, wherein:
the second area overlaps with the second display area in a plan view;
the plurality of pixels comprise a plurality of first electrodes, a plurality of light emitting layers disposed on the plurality of first electrodes, respectively, and a second electrode disposed on the plurality of light emitting layers;
the second electrode is disposed throughout the first display area and the second display area; and
a plurality of openings spaced apart from each other are defined in a portion of the second electrode overlapping the second area of the anti-reflector.

2. The display device of claim 1, further comprising an electronic module disposed under the second display area of the display panel,
wherein external light reflection suppressing performance of the first and second areas is compensated by providing the plurality of openings in the second display area.

3. The display device of claim 1, wherein the anti-reflector comprises a polarizer.

4. The display device of claim 3, wherein the second area of the anti-reflector is decolored.

5. The display device of claim 1, wherein the second area of the anti-reflector comprises a hole defined therein, the hole completely penetrating through the anti-reflector from an upper surface to a lower surface of the anti-reflector.

6. The display device of claim 1, wherein the second display area comprises a first sub-area having a first reflectance and a second sub-area having a second reflectance, and wherein the first reflectance is higher than the second reflectance.

7. The display device of claim 6, wherein the first sub-area comprises at least one pixel among the plurality of pixels, the at least one pixel comprising:
a light emitting element comprising a first electrode, a light emitting layer, and the second electrode; and
a pixel circuit electrically connected to the light emitting element, the pixel circuit comprising a signal line and a transistor.

8. The display device of claim 7, wherein the second sub-area comprises at least one dummy pixel disposed therein, the at least one dummy pixel comprising a same structure as the at least one pixel disposed in the first sub-area except for omission of at least one of the first electrode, the light emitting layer, the second electrode, and the transistor.

9. The display device of claim 6, wherein the first sub-area comprises a plurality of first sub-areas and the second sub-area comprises a plurality of second sub-areas, and wherein the plurality of first sub-areas and the plurality of second sub-areas are alternately arranged in a first direction and a second direction crossing the first direction.

10. The display device of claim 6, wherein the second sub-area comprises a plurality of second sub-areas, and the first sub-area is surrounded by the plurality of second sub-areas.

11. The display device of claim 6, wherein the first sub-area comprises at least one pixel light emitting area.

12. The display device of claim 1, wherein the second area is surrounded by the first area when viewed in the plan view, and the second display area is surrounded by the first display area in the plan view.

13. The display device of claim 1, wherein the second area is disposed adjacent to an edge of the anti-reflector, and at least one side of the second area is shared with the first area.

14. A display device comprising:

a window;

an anti-reflector disposed under the window, the anti-reflector comprising a first area and a second area having different transmittances from each other;

a display panel disposed under the anti-reflector, the display panel comprising a first display area, a second display area having different reflectances from each other, and a plurality of pixels disposed in the first display area and the second display area; and an electronic module disposed under the display panel, wherein the second area, the second display area, and the electronic module overlap with each other in a plan view, wherein:

the plurality of pixels comprise a plurality of first electrodes, a plurality of light emitting layers disposed on the plurality of first electrodes, respectively, and a second electrode disposed on the plurality of light emitting layers;

the second electrode is disposed throughout the first display area and the second display area; and a plurality of openings spaced apart from each other are defined in a portion of the second electrode overlapping the second area of the anti-reflector.

15. The display device of claim 14, wherein:

the first area has a first transmittance and the second area has a second transmittance, the first transmittance being lower than the second transmittance;

the first display area has a first reflectance and the second display area has a second reflectance, the first reflectance being higher than the second reflectance; and external light reflection suppressing performance of the first and second areas is compensated by providing the plurality of openings in the second display area.

16. The display device of claim 14, wherein:

the anti-reflector comprises a polarizer; and the second area comprises a hole defined therein, the hole completely penetrating through the anti-reflector from an upper surface to a lower surface of the anti-reflector.

17. The display device of claim 14, wherein the second display area comprises:

a first sub-area comprising at least one pixel among the plurality of pixels; and a second sub-area in which at least one dummy pixel is disposed, wherein the at least one pixel comprises a light emitting element and a pixel circuit electrically connected to the light emitting element, wherein the light emitting element comprises a first electrode, a light emitting layer, and the second electrode, the pixel circuit comprises a signal line and a transistor, and wherein the at least one dummy pixel comprises a same structure as the at least one pixel disposed in the first sub-area except for omission of at least one of the first electrode, the light emitting layer, the second electrode, and the transistor.

18. The display device of claim 17, wherein the second electrode in the second sub-area comprises an opening formed therethrough.

* * * * *